United States Patent
Chou et al.

(10) Patent No.: US 12,069,851 B2
(45) Date of Patent: Aug. 20, 2024

(54) TRANSISTOR, MEMORY AND METHOD OF FORMING SAME

(71) Applicant: FUJIAN JINHUA INTEGRATED CIRCUIT CO., LTD., Fujian (CN)

(72) Inventors: Chung-Yen Chou, Fujian (CN); Chih-Yuan Chen, Fujian (CN); Qinfu Zhang, Fujian (CN); Chao-Wei Lin, Fujian (CN); Chia-Yi Chu, Fujian (CN); Jen-Chieh Cheng, Fujian (CN); Jen-Kuo Wu, Fujian (CN); Huixian Lai, Fujian (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 273 days.

(21) Appl. No.: 17/298,315

(22) PCT Filed: Mar. 17, 2020

(86) PCT No.: PCT/CN2020/079583
§ 371 (c)(1),
(2) Date: May 28, 2021

(87) PCT Pub. No.: WO2021/022812
PCT Pub. Date: Feb. 11, 2021

(65) Prior Publication Data
US 2022/0028867 A1    Jan. 27, 2022

(30) Foreign Application Priority Data

Aug. 16, 2019  (CN) .......................... 201910759563.1
Sep. 4, 2019   (CN) .......................... 201910833563.1

(51) Int. Cl.
*H10B 12/00*     (2023.01)

(52) U.S. Cl.
CPC ........... *H10B 12/488* (2023.02); *H10B 12/34* (2023.02)

(58) Field of Classification Search
CPC ........... H01L 29/4236; H01L 29/42368; H01L 29/66621; H01L 29/78; H10B 12/34; H10B 12/488
See application file for complete search history.

(56) References Cited

U.S. PATENT DOCUMENTS

| | | | |
|---|---|---|---|
| 2002/0155654 A1* | 10/2002 | Dyer | H10B 12/0383 |
| | | | 257/E21.655 |
| 2006/0270151 A1 | 11/2006 | Lee | |
| 2011/0018057 A1* | 1/2011 | Kim | H01L 29/78 |
| | | | 438/270 |

FOREIGN PATENT DOCUMENTS

| | | | | |
|---|---|---|---|---|
| CN | 102737972 A | | 10/2012 | |
| CN | 108511518 A | * | 9/2018 | ....... H01L 21/02233 |

(Continued)

*Primary Examiner* — Michelle Mandala
*Assistant Examiner* — Kevin Quinto
(74) *Attorney, Agent, or Firm* — Winston Hsu

(57) ABSTRACT

A transistor, a memory and a method of forming the same are disclosed. The transistor includes a gate dielectric layer (200) having an upper portion (200*b*) and a lower portion (200*a*). The upper portion (200*b*) is multi-layer structure having an increased thickness without changing a thickness of the lower portion (200*a*). In this way, gate-induced drain current leakage of the transistor can be mitigated at uncompromised performance thereof. Additionally, the upper portion (200*b*) designed as multi-layer structure having an increased thickness can facilitate flexible adjustment in parameters of the upper portion (200*b*). The memory device includes dielectric material layers (DL), which are formed in respective word line trenches and each have an upper portion and a lower portion. In addition, in both trench isolation structures (STI) and active areas (AA), the upper (Continued)

portion of the dielectric material layers (DL) has a thickness greater than a thickness of the lower portion. In this way, current leakage between word lines (WL) and the active areas (AA) can be mitigated.

19 Claims, 14 Drawing Sheets

(56) References Cited

FOREIGN PATENT DOCUMENTS

| | | |
|---|---|---|
| CN | 108511518 A | 9/2018 |
| CN | 208225880 U | 12/2018 |
| CN | 210296374 U | 4/2020 |
| CN | 210296385 U | 4/2020 |

* cited by examiner

TRANSISTOR, MEMORY AND METHOD OF FORMING SAME

TECHNICAL FIELD

The present invention relates to the field of semiconductor technology and, in particular, to a transistor, a memory and a method of fabricating the same.

BACKGROUND

Increasing shrinkage of semiconductor devices has led to dramatic decreases in feature sizes of field-effect transistors (FETs) and thicknesses of gate dielectric layers therein. As a result, concern about the issue of performance reliability associated with increasingly thin gate dielectric layers is on rise.

Specifically, a thinner transistor tends to suffer from increased gate-induced drain leakage (GIDL) in an off or quiescent state, which is quite detrimental to reliability of the transistor because it may make it more instable or increase its static power consumption. With the increasing shrinkage of feature sizes of transistors, how to reduce device current leakage has become one of the key challenges to high density, low power consumption semiconductor technology.

In addition, the increasing shrinkage of semiconductor devices has also led to dramatic decreases in feature sizes of various components in the semiconductor devices. Consequently, adjacent components are brought increasingly closer to each other, making current leakage easier to occur between them.

For memory devices (e.g., dynamic random access memory (DRAM)), dimensional shrinkage may lead to easier current leakage between word lines buried in the substrate and adjacent active areas.

SUMMARY OF THE INVENTION

It is an objective of the present invention to provide transistors, a memory device and methods of fabricating them, which can mitigate the problem of current leakage with conventional semiconductor devices.

The above objective is attained by a transistor provided in the present invention, which includes:

a substrate with a gate trench formed therein; and a gate dielectric layer covering an inner surface of the gate trench, the gate dielectric layer including an upper portion and a lower portion, the upper portion covering a portion of the inner surface of the gate trench that is higher than a first predetermined height level, the lower portion covering a portion of the inner surface of the gate trench that is lower than the first predetermined height level, the upper portion including a liner layer and a cover layer, the liner layer covering the inner surface of the gate trench, the cover layer covering a side surface of the liner layer away from the gate trench, wherein a sum of a thickness of the liner layer and a thickness of the cover layer is greater than a thickness of the lower portion.

Based on the above transistor, the present invention also provides a method of fabricating a transistor, which includes:

providing a substrate with a gate trench formed therein; and forming a gate dielectric layer over an inner surface of the gate trench, the gate dielectric layer including an upper portion and a lower portion, the upper portion covering a portion of the inner surface of the gate trench higher than a first predetermined height level, the lower portion covering a portion of the inner surface of the gate trench lower than the first predetermined height level, the upper portion including a liner layer and a cover layer, the liner layer covering the inner surface of the gate trench, the cover layer covering a side surface of the liner layer away from the gate trench, wherein a sum of a thickness of the liner layer and a thickness of the cover layer is greater than a thickness of the lower portion.

In the transistor provided in the present invention, the upper and lower portions in the gate dielectric layer have different thicknesses, and each upper portion is a multi-layer structure consisting of the liner and cover layers. In this way, the upper portions of the gate dielectric layer can be thickened, with the lower portion maintaining a conventional thickness. As a result, gate-induced drain leakage current (GIDL) can be mitigated at uncompromised turn-on performance and saturation current performance of the transistor, thus overcoming the problem of conflicting performance enhancement and GIDL mitigation as found in conventional transistors.

Further, it is to be noted that since the upper portions of the gate dielectric layer are thickened by their multi-layer design, parameters (e.g., thickness, material, etc.) of the constituent layers of the upper portions can be flexibly adjusted to meet various requirements of different practical applications.

The present invention also provides a memory device, including:

a substrate formed therein with a plurality of active areas and at least one trench isolation structure, each trench isolation structure separating adjacent ones of the plurality of active areas, and the substrate further formed with at least one word line trench each extending in a predetermined direction to pass across corresponding ones of the plurality of active areas and corresponding ones of the trench isolation structures in the predetermined direction;

a dielectric material layer covering an inner surface of a respective word line trench and having an upper portion and a lower portion vertically joined to the upper portion, the upper portion and the lower portion both extending continuously in the predetermined direction so that the upper portion and the lower portion cover both an inner surface portion of the word line trench in the corresponding active areas and an inner surface portion of the word line trench in the trench isolation structures, the upper portion having a thickness greater than a thickness of the lower portion; and at least one word line, each of which is formed on the dielectric material layer, fills the respective word line trench, and extends from the lower portion to the upper portion.

Based on the above memory device, the present invention also provides a method of fabricating a memory device, which includes:

providing a substrate, in which at least one trench isolation structure is formed, and a plurality of active areas are defined by the at least one trench isolation structure;

forming at least one word line trench in the substrate, each extending in a predetermined direction to pass across corresponding ones of the plurality of active areas and corresponding ones of the trench isolation structures in the predetermined direction;

forming a dielectric material layer on an inner surface of a respective one of the word line trenches, the dielectric material layer having an upper portion and a lower portion vertically joined to the upper portion, the upper portion and the lower portion both extending continuously in the predetermined direction so that the upper portion and the lower portion cover both an inner surface portion of the word line trench in the corresponding active areas and an inner surface portion of the word line trench in the trench isolation structures, the upper portion having a thickness greater than a thickness of the lower portion; and forming word lines in the respective word line trenches, each of the word lines forming on the dielectric material layer and extending from the lower portion to the upper portion.

In the memory device provided in the present invention, the upper and lower portions of the dielectric material layers formed in the word line trenches have different thicknesses and both extend in the direction of extension of the word lines so that they cover both inner surface portions of the word line trench in the active areas and inner surface portions of the word line trench in the trench isolation structures. Moreover, the thickness of the upper portions is greater than that of the lower portions. In this way, current leakage between the word lines and the active areas can be mitigated by the thicker upper portions. In particular, current leakage between the portions of the word lines in the trench isolation structures and the active areas can be effectively mitigated.

LIST OF REFERENCE NUMERALS IN THE DRAWINGS

10—substrate;
100/100'—Gate Conductive Layer;
100a/100a'—Gate Trench;
110a—First Trench;
200/200'—Gate Dielectric Layer;
210/210'—First Dielectric Layer;
220/220'—Second Dielectric Layer;
200a/200a'—Lower Portion;
200b/200b'—Upper Portion;
210b/210b'—Liner Layer;
220b/220b'—Cover Layer;
310—First Source/Drain Region;
320—Second Source/Drain Region;
400—Insulating Dielectric Layer;
500—Sacrificial Layer;
H1—First Height Level;
H2—Second Height Level;
H3—Third Height Level;
600—Substrate;
610a—Upper Trench;
700—Insulating Dielectric Layer;
800—Sacrificial Layer;
WL—Word Line;
DL/DL'—Dielectric Material Layer;
DL1/DL1'—First Dielectric Layer;
DL2/DL2'—Second Dielectric Layer;
AA—Active Area;
STI—Trench Isolation Structure;
S/D1—First Source/Drain Region;
S/D2—Second Source/Drain Region;
Tr1—First Trench;
Tr2—Second Trench;
D1/D2—Opening Size;
H4—Fourth Height Level;
H5—Fifth Height Level;
H6—Sixth Height Level.

DETAILED DESCRIPTION

As mentioned in the Background section, the increasing dimensional shrinkage has led to thinner gate dielectric layers in conventional transistors and hence a more significant gate-induced drain leakage (GIDL) problem therewith.

Although directly thickening the gate dielectric layers is considered as a solution that can mitigate the GIDL problem with conventional transistors, it would, on the other hand, have adverse impacts on the transistors' turn-on performance, such as increasing their turn-on voltages, reducing their saturation currents, or raising other issues. Therefore, performance enhancement of the transistors and mitigation of GIDL conflict with each other, and it is hard for conventional transistors to achieve both at the same time.

In view of this, the present invention provides a transistor with both uncompromised performance and mitigated current leakage. The present invention also provides a memory device with mitigated current leakage.

Transistors, memory devices and methods of fabricating them proposed in the present invention will be described in greater detail below by way of specific embodiments with reference to the accompanying drawings. Advantages and features of the present invention will be more apparent from the following detailed description. Note that the figures are provided in a very simplified form not necessarily drawn to exact scale, and they are only intended to facilitate convenience and clarity in explaining the disclosed embodiments.

Embodiment 1

Figure 1A:
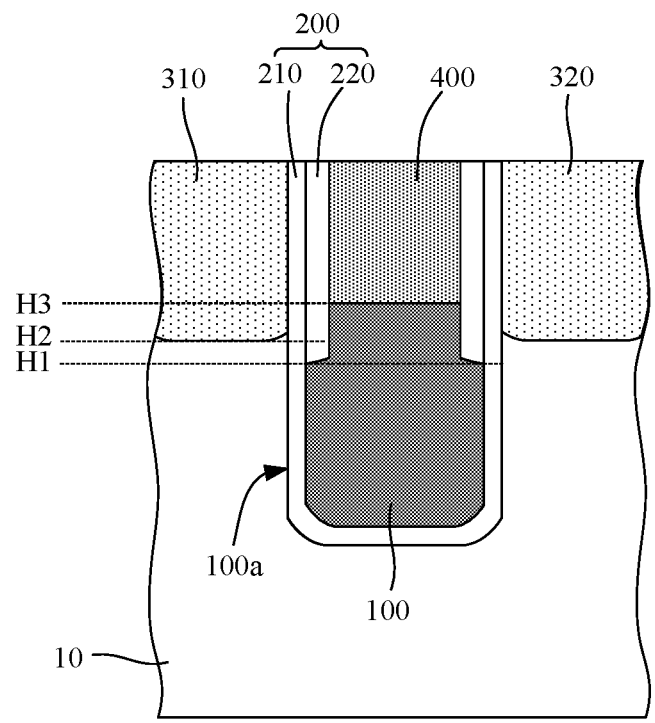
FIG. 1a is a structural schematic of a transistor of Embodiment 1 of the present invention.
Figure 1B:
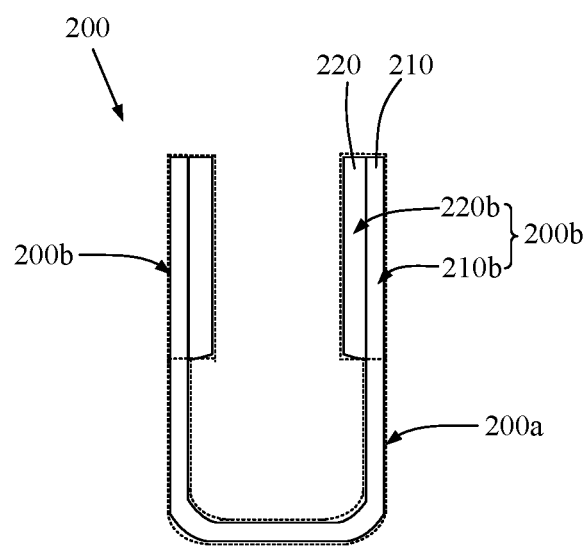
FIG. 1b is a structural schematic of a gate dielectric layer in the transistor of Embodiment 1 of the present invention.

FIG. 1a is a structural schematic of a transistor of Embodiment 1 of the present invention, and FIG. 1b is a structural schematic of a gate dielectric layer in the transistor of Embodiment 1 of the present invention. As shown in FIGS. 1a and 1b, the transistor includes: a substrate 10 with a gate trench 100a formed therein; and a gate dielectric layer 200 covering an inner surface of the gate trench 100a.

Referring particularly to FIG. 1b, in conjunction with FIG. 1a, the gate dielectric layer 200 has upper portions 200b and a lower portion 200a. The upper portions 200b cover respective portions of the inner surface of the gate trench 100a higher than a first predetermined height level (i.e., the first height level H1), and the lower portion 200a covers a portion of the inner surface of the gate trench 100a lower than the first predetermined height level (i.e., the first height level H1).

Each of the upper portions 200b is a multi-layer structure, each upper portion 200b has a thickness greater than a thickness of the lower portion 200a. In this embodiment, each upper portion 200b includes a liner layer 210b and a cover layer 220b. The liner layer 210b covers the inner surface of the gate trench 100a, and the cover layer 220b covers an outer side surface of the liner layer 210b (i.e., the side surface of the liner layer 210b away from the inner surface of the gate trench 100a). A total thickness of the liner and cover layers 210b, 220b is greater than the thickness of the lower portion 200a.

Additionally, in the gate dielectric layer 200 of this embodiment, the difference between the thickness of the lower portion 200a and that of the liner layer 210b may be smaller than a thickness of the cover layer 220b. Alternatively, the difference between the thickness of the lower portion 200a and that of the cover layer 220b may be smaller than the thickness of the liner layer 210b. In this way, the total thickness of the liner and cover layers 210b, 220b is definitely greater than the thickness of the lower portion 200a.

In a specific embodiment, the difference between the thicknesses of the lower portion 200a and the liner layer 210b may be very small (i.e., the difference between the thicknesses is smaller than the thickness of the cover layer 220b). For example, the thicknesses of the lower portion 200a and the liner layer 210b may be equal or close to each other. In this case, since the upper portion 200b further includes the cover layer 220b, the thickness of the upper portion 200b will be definitely greater than the thickness of the lower portion 200a.

With continued reference to FIG. 1a, in specific embodiments of the transistor, the lower portion 200a of the gate dielectric layer 200 may be positioned between a gate conductive layer 100 and a portion of the substrate configured to provide a conductive channel. The lower portion 200a may be adapted to the actual needs in order to ensure that desired turn-on performance and saturation current performance of the transistor can be obtained. Moreover, the upper portions 200b of the gate dielectric layer 200 may be positioned at least between the gate conductive layer 100 and respective source/drain regions. The greater thickness of each upper portion 200b can effectively mitigate gate-induced drain leakage (GIDL) of the transistor and reduce the current leakage of the transistor, thus resulting in an additional increase in its overall performance. That is, the transistor of this embodiment has improved overall performance featuring both assured turn-on performance and saturation current performance and mitigated gate-induced drain leakage current (GIDL).

It would be appreciated that, in this embodiment, the first predetermined height level is not higher than a bottom boundary of equally high portions of the gate conductive layer and the source/drain regions.

Specifically, the source/drain regions in the transistor may include a first source/drain region 310 on one side of the gate trench 100a and a second source/drain region 320 on the other side of the gate trench 100a. The first and second source/drain regions 310, 320 may so extend as to each have a side boundary contiguous with a proximal side surface of the gate trench 100a. Moreover, the first and second source/drain regions 310, 320 each have a bottom boundary not lower than the first predetermined height level. In this embodiment, the first and second source/drain regions 310, 320 may each have a bottom situated at a second height level H2, and the second height level H2 is higher than the first height level H1.

Additionally, the gate conductive layer 100 may be formed over the gate dielectric layer 200 and within the gate trench 100a. Moreover, the gate conductive layer 100 may extend from the lower portion 200a of the gate dielectric layer 200 to the upper portions 200b thereof, so that a top of the gate conductive layer 100 is higher than the first predetermined height level (i.e., the first height level H1).

Specifically, the top of the gate conductive layer 100 may be positioned at a third height level H3, the third height level H3 is higher than the first height level H1. In addition, the third height level H3 may be further higher than the second height level H2. It can be considered that the equally high portions of the gate conductive layer 100 and the source/drain regions are situated between the second height level H2 and the third height level H3.

As noted above, the upper portions 200b of the gate dielectric layer 200 cover the respective portions of the inner surface of the gate trench 100a that are higher than the first predetermined height level. Thus, the upper portions 200b cover respective portions of the inner surface of the gate trench 100a between the second height level H2 and the third height level H3. In this way, the gate conductive layer 100 is separated from the source/drain regions by the thicker upper portions 200b.

With continued reference to FIGS. 1a and 1b, the gate dielectric layer 200 may include a first dielectric layer 210 covering the trench's inner surface and second dielectric layers 220 residing on the first dielectric layer 210. The first and second dielectric layers 210, 220 may be formed of the same material including, for example, silicon oxide. Of course, it is also possible for them to be formed of different materials, as detailed below.

In this embodiment, the first dielectric layer 210 may cover the inner surface of the gate trench 100a, and the portion of the first dielectric layer 210 lower than the first predetermined height level (i.e., the first height level H1) forming the lower portion 200a. Moreover, portions of the first dielectric layer 210 higher than the first predetermined height level (i.e., the first height level H1) may form the respective liner layers 210b of the upper portions 200b. Further, portions of the second dielectric layers 220 covering the respective portions of the first dielectric layer 210 higher than the first predetermined height level may form the respective cover layers 220*b* of the upper portions 200*b*.

It would be appreciated that, in this embodiment, the lower portion 200*a* of the gate dielectric layer 200 is provided by the first dielectric layer 210, and the upper portions 200*b* of the gate dielectric layer are provided both by the first dielectric layer 210 and the second dielectric layers 220 thereon and thus thicker than the upper portions 200*b*. It should be recognized that the thickness of the second dielectric layers 220 may be adapted as actually needed without affecting the thickness of the first dielectric layer 210. For example, each second dielectric layer 220 may have a thickness in a direction perpendicular to the trench's side surfaces greater than or equal to a thickness of the first dielectric layer 210 in the direction perpendicular to the trench's side surfaces.

As noted above, the first and second dielectric layers 210, 220 may be made either of the same material or of different materials. In this embodiment, the material of the first dielectric layer 210 that provides the lower portion and contributes to the upper portions may include, for example, silicon oxide (SiO). The material of the second dielectric layers 220 that contribute to the upper portions may be selected according to the actual needs. Specifically, the second dielectric layers 220 may be formed of the same material as the first dielectric layer 210. In this case, the upper portions 200*b* are thickened portions of the homogeneous material. Alternatively, the second dielectric layers 220 may be formed of a material with good barrier properties (the material of the second dielectric layers 220 includes, for example, silicon nitride or the like). This can not only thicken the upper portions 200*b* but also result in an additional reduction in gate-induced drain leakage current (GIDL).

Additionally, the inner surface of the gate trench 100*a* may be a flat, smooth surface, and the first dielectric layer 210 may cover the inner surface of the gate trench 100*a* while conforming to the contour of the gate trench 100*a*. The second dielectric layers 220 may reside on outer side surfaces of the first dielectric layer 210 (i.e., the side surfaces of the first dielectric layer 210 away from the inner surface of the gate trench 100*a*) so as to form the cover layers 220*b* of the upper portions 200*b*. As a result, the cover layers 220*b* protrude from the lower portion 200*a* away from the trench's inner surface.

It can be considered that the gate dielectric layer 200 covers the inner surface of the gate trench 100*a* and defines a receptacle in which the gate conductive layer is accommodated. In the gate dielectric layer 200, since each upper portion 200*b* protrudes from the lower portion 200*a* away from the trench's inner surface, an opening size of the receptacle defined by the gate dielectric layer 200 higher than the first predetermined height level is smaller than an opening size of the receptacle lower than the first predetermined height level. Accordingly, the gate conductive layer 100 filled in the receptacle has a portion higher than the first predetermined height level, which has side surfaces recessed from respective side surfaces of a portion of the gate conductive layer 100 lower than the first predetermined height level. Therefore, the portion of the gate conductive layer 100 higher than the first predetermined height level has a width smaller than a width of the portion of the gate conductive layer 100 lower than the first predetermined height level.

With continued reference to FIG. 1*a*, a top of the gate conductive layer 100 may be lower than top edges of the gate trench 100*a*, and an insulating dielectric layer 400 residing on the gate conductive layer 100 may be filled in a space within the gate trench 100*a* above the gate conductive layer 100.

It would be appreciated that, in the transistor of this embodiment, the gate dielectric layer 200 includes a first dielectric layer 210 and a second dielectric layers 220, the first dielectric layers 210 covers both bottom and side surfaces of the gate trench 100*a*, the second dielectric layers 220 covers the portions of the first dielectric layer 210 higher than the first predetermined height level (the first height level H1), so that the portions of the gate dielectric layer 200 higher than the first predetermined height level protrude from the portion of the gate dielectric layer 200 lower than the first predetermined height level away from the trench's respective side surfaces.

Moreover, in the transistor, the gate conductive layer 100 may be filled in the gate trench 100*a*, and the side surfaces of the portion of the gate conductive layer 100 lower than the first predetermined height level are contiguous with the first dielectric layer 210, and the side surfaces of the portion of the gate conductive layer 100 higher than the first predetermined height level are contiguous with the second dielectric layers 220. Thus, the gate conductive layer 100 may generally have a tapered shape.

A method of fabricating the transistor of this embodiment will be described in detail below. The following detailed description is set forth with reference to FIGS. 2*a* to 2*f*, which are schematic illustrations of structures formed in the method.

Figure 2A:
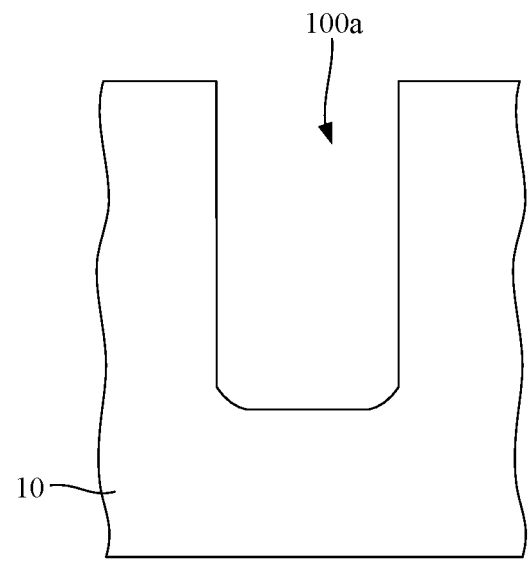
FIGS. 2a to 2f are schematic illustrations of structures formed in a method for fabricating the transistor of Embodiment 1 of the present invention.

At first, referring to FIG. 2*a*, the substrate 10 is provided, and a gate trench 100*a* is formed in the substrate 10.

In this embodiment, the gate trench 100*a* is formed first, and the gate dielectric layer is then formed in the gate trench 10*a*. The formation of the gate dielectric layer of this embodiment will be described in detail below with reference to FIGS. 2*b* to 2*d*.

Figure 2B:
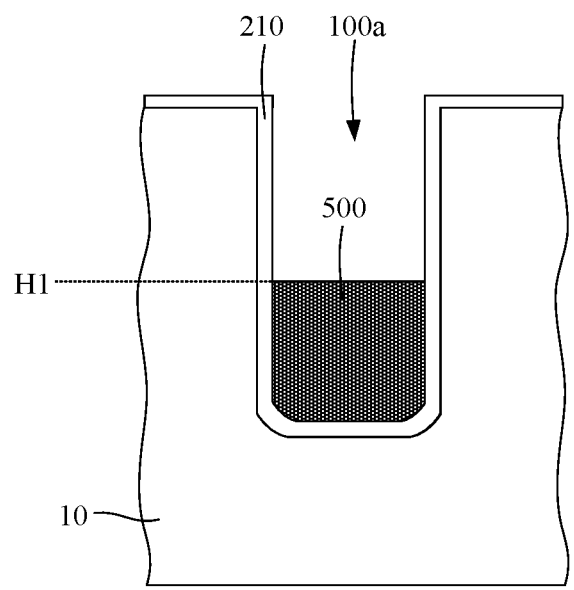

With particular reference to FIG. 2*b*, the first dielectric layer 210 is formed over the inner surface of the gate trench 100*a*. The material of the first dielectric layer 210 may include, for example, silicon oxide.

The formation of the first dielectric layer 210 may be accomplished, for example, by a thermal oxidation process. In this embodiment, during the formation of the first dielectric layer 210 over the inner surface of the gate trench 100*a*, a dielectric layer may be also formed on a top surface of the substrate 10.

It is to be noted that the portion of the first dielectric layer 210 lower than the first predetermined height level may serve to form the gate dielectric layer between the gate conductive layer and the conductive channel of the formed transistor. Therefore, the thickness of the first dielectric layer 210 may be selected according to the desired transistor to be fabricated to meet the performance of the transistor being fabricated.

Referring to FIG. 2*b*, a sacrificial layer 500 may be filled in the gate trench 100*a*. The sacrificial layer 500 may extend upward from the bottom of the gate trench 100*a* to the first predetermined height level (the first height level H1). In other words, the formed sacrificial layer 500 covers the portion of the first dielectric layer 210 lower than the first predetermined height level, with the outer side surfaces of the portions of the first dielectric layer 210 higher than the sacrificial layer remaining exposed.

The sacrificial layer 500 may be made of a material including, for example, an organic material. For example, the formation of the sacrificial layer 500 may include: filling the organic material into the gate trench 100*a* by a spin-coating process; and then performing an etch-back process to lower a top surface of the organic material in the gate trench 100*a* down to the first predetermined height level, thereby obtaining the sacrificial layer 500.

Figure 2C:
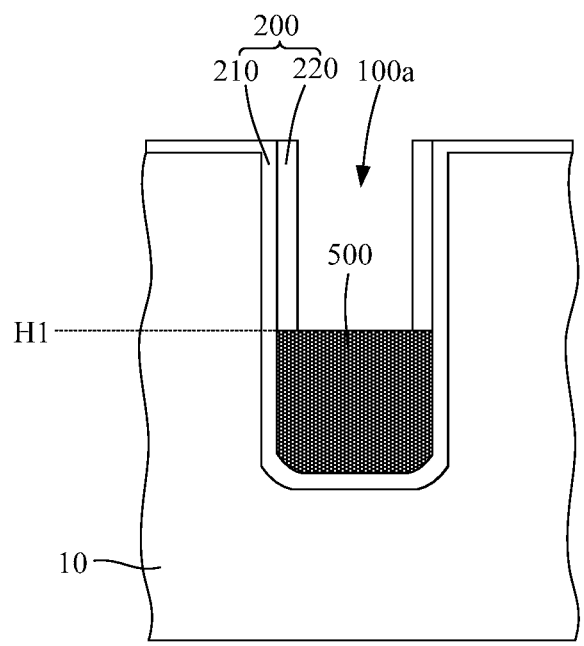

Referring to FIG. 2*c*, the second dielectric layers 220 are formed on the respective exposed outer side surface portions of the first dielectric layer 210. That is, the second dielectric layers 220 are formed on the outer side surfaces of the portions of the first dielectric layer 210 higher than the first predetermined height level.

The first and second dielectric layers 210, 220 form the gate dielectric layer, with the portion of the first dielectric layer 210 lower than the first predetermined height level forming the lower portion, the portions of the first dielectric layer 210 higher than the first predetermined height level forming the respective liner layers, and the second dielectric layers 220 forming the cover layers.

Additionally, the material of the second dielectric layers 220 may be the same as the first dielectric layer 210 and include, for example, silicon oxide. The second dielectric layers 220 may be formed by a chemical vapor deposition (CVD) process or an atomic layer deposition (ALD) process. Alternatively, it may also be formed by an in-situ steam generation (ISSG) oxidation process to obtain a high-quality gate dielectric layer.

Specifically, the formation of the second dielectric layers 220 may include: at first, depositing a dielectric material layer over the substrate 10, which covers the exposed outer side surface portions of the first dielectric layer 210, the top surface of the sacrificial layer 500 and the top surface of the substrate 10; and then performing an etch-back process to remove portions of the dielectric material layer over the top surfaces of the substrate and the sacrificial layer, with portions of the dielectric material layer over the outer side surface portions of the first dielectric layer remaining to form the second dielectric layers 220.

Figure 2D:
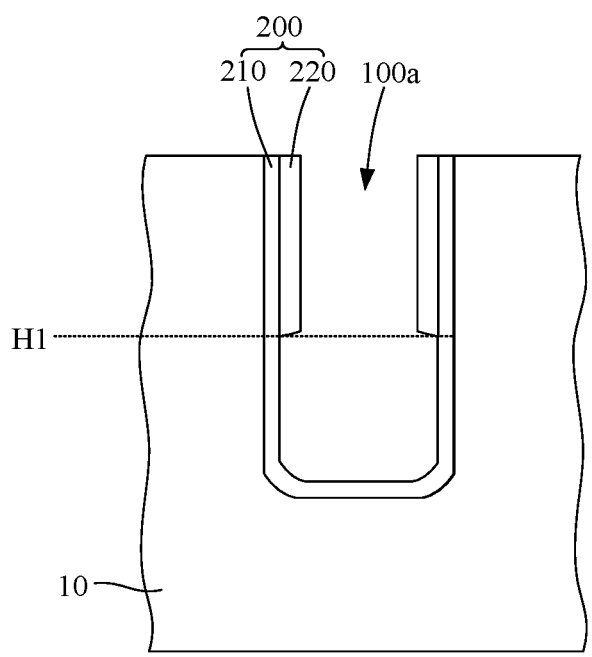

Referring to FIG. 2*d*, the sacrificial layer 500 is removed so that the portion of the first dielectric layer 210 lower than the first predetermined height level is exposed.

In the gate dielectric layer of this embodiment, the lower portion is provided by the first dielectric layer 210, and each of the upper portions is made up of a portion of the first dielectric layer 210 and one of the second dielectric layers 220. Therefore, the upper portions both protrude from the lower portion away from the trench's inner surface.

Figure 2E:
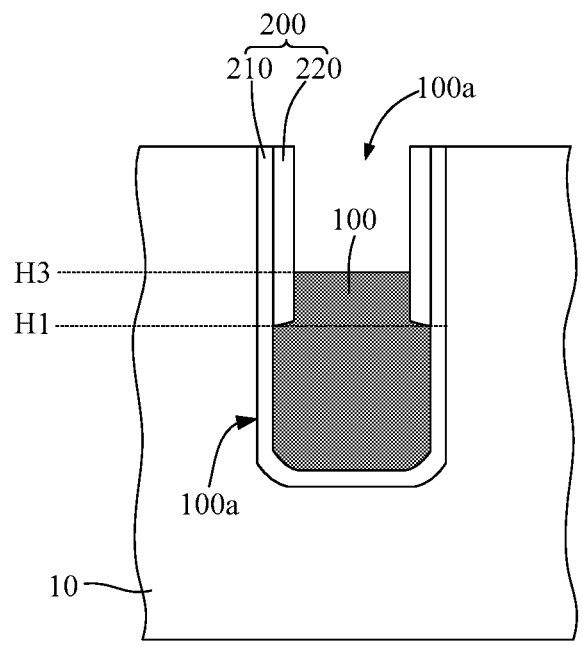

Referring to FIG. 2*e*, the method may further include, subsequent to the formation of the gate dielectric layer, forming the gate conductive layer 100 in the gate trench 100*a*. The material of the gate conductive layer 100 may include polysilicon, tungsten or the like.

Specifically, the top of the gate conductive layer 100 (at the third height level H3) may be higher than the first predetermined height level (the first height level H1). That is, the gate conductive layer 100 may extend from the lower portion of the gate dielectric layer 200 to the upper portions thereof.

In this embodiment, the top of the gate conductive layer 100 may also be lower than the top surface of the substrate 10. That is, the gate conductive layer 100 may not fill up the gate trench 100*a*. Specifically, for example, an etch-back process may be employed to lower the top of the gate conductive layer 100 in the gate trench 100*a* down to a level lower than the top surface of the substrate 10.

Figure 2F:
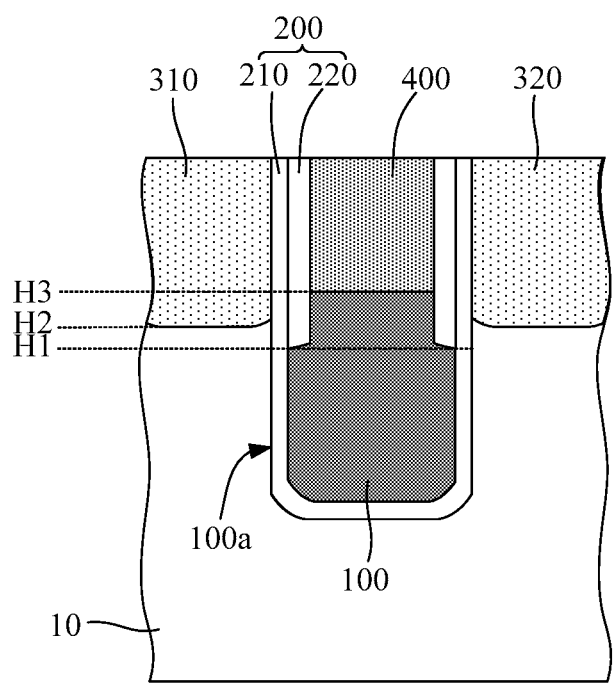

Additionally, with particular reference to FIG. 2*f*, the method of fabricating the transistor may further include filling the insulating dielectric layer 400 in the space of the gate trench 100*a* above the gate conductive layer 100 so that the insulating dielectric layer 400 resides on the gate conductive layer 100. The material of the insulating dielectric layer 400 may include, for example, silicon nitride.

With continued reference to FIG. 2*f*, the method of fabricating the transistor may further include forming the source/drain regions in the substrate 100. Each of the source/drain regions may have a side boundary contiguous with a portion of a proximal side surface of the gate trench 100*a*, which is close to a top opening of the trench. Each of the source/drain regions may have a bottom boundary (corresponding to the second height level H2) that is lower than the top of the gate conductive layer (the third height level H3) and higher than the first predetermined height level (the first height level H1).

As such, the gate conductive layer 100 and the source/drain regions have equally high portions between the second height level H2 and the third height level H3, and the gate conductive layer 100 and the source/drain regions are separated from one another by the upper portions of the gate dielectric layer 200 at the high portions.

Specifically, the source/drain regions may include the first source/drain region 310 and the second source/drain region 320, and the first source/drain region 310 and the second source/drain region 320 are located on different sides of the gate trench 100*a*.

It is to be noted that, although the source/drain regions are formed after the gate trench and the gate conductive layer have been formed in this embodiment, in other embodiments, it is also possible that the formation of the source/drain regions precedes that of the gate trench and the gate conductive layer, and the present invention is not limited in this regard.

Embodiment 2

Differing from Embodiment 1, a gate dielectric layer in Embodiment 2 has a lower portion and upper portions each protruding from the lower portion toward the trench's inner surface. The transistor of this embodiment will be described in detail below with reference to FIGS. 3*a* and 3*b*.

Figure 3A:
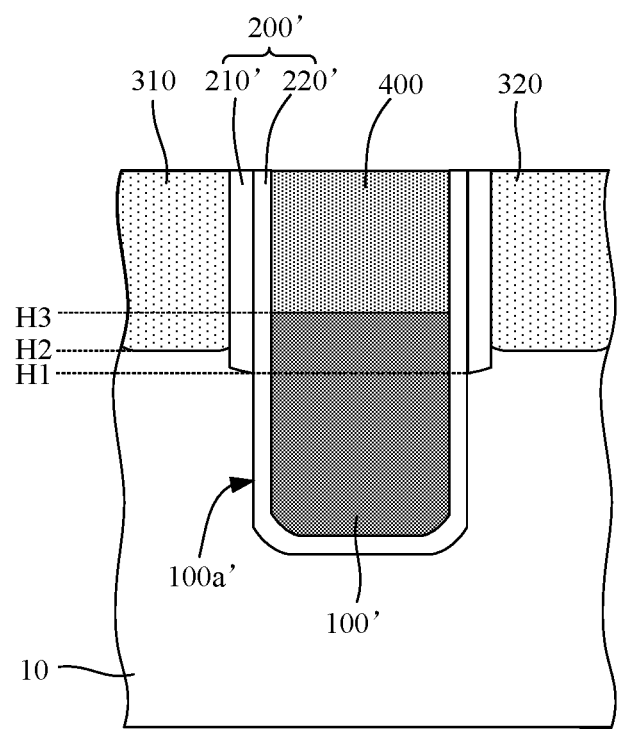
FIG. 3a is a structural schematic of a transistor of Embodiment 2 of the present invention.
Figure 3B:
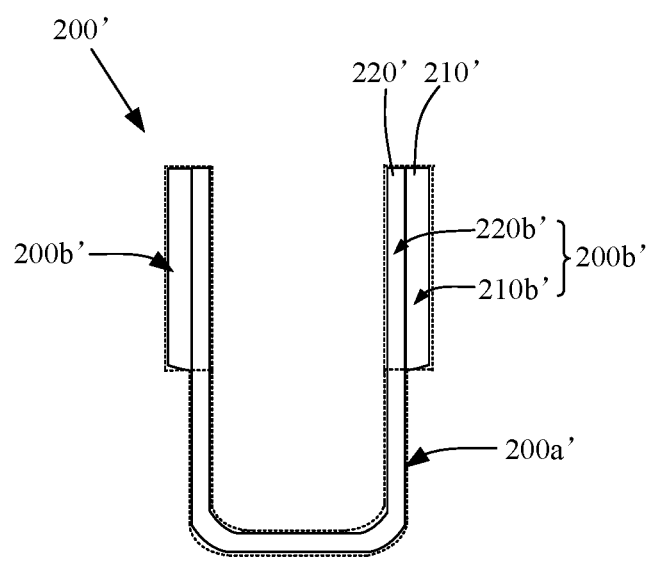
FIG. 3b is a structural schematic of a gate dielectric layer in the transistor of Embodiment 2 of the present invention.

FIG. 3*a* is a structural schematic of a transistor of Embodiment 2 of the present invention, and FIG. 3*b* is a structural schematic of the gate dielectric layer in the transistor of Embodiment 2 of the present invention. As shown in FIGS. 3*a* and 3*b*, in this embodiment, the gate dielectric layer 200' includes first dielectric layers 210' and a second dielectric layer 220'.

The first dielectric layers 210' cover respective portions of the inner surface of the gate trench 100*a*' higher than the first predetermined height level (the first height level H1) and form liner layers 210*b*' of the respective upper portions 200*b*'. The second dielectric layer 220' covers both the first dielectric layers 210' and a portion of the gate trench 100*a*' lower than the first predetermined height level. Portions of the second dielectric layer 220' higher than the first predetermined height level form cover layer 220*b*', and the remaining portion of the second dielectric layer 220' lower than the first predetermined height level forms the lower portion 200*a*'.

It would be appreciated that, in this embodiment, the lower portion 200*a*' of the gate dielectric layer 200' is provided by the second dielectric layer 220', and each upper portions 200*b*' of the gate dielectric layer is made up of a portion of the second dielectric layer 220' and one of the first dielectric layers 210'. In this way, each upper portions 200*b*' can also have an increased thickness. It should be recognized that the thickness of the first dielectric layers 210' may be adapted as actually needed without affecting the thickness of the second dielectric layer 220'. For example, each first dielectric layer 210' may have a thickness in a direction perpendicular to the trench's side surfaces greater than or equal to a thickness of the second dielectric layer 220' in the direction perpendicular to the trench's side surfaces.

With similarity to Embodiment 1, the first and second dielectric layers 210', 220' may also be formed either of the same material or of different materials. Specifically, the material of the second dielectric layer 220' that provides the lower portion and contributes to the upper portions may include, for example, silicon oxide. The material of the first dielectric layers 210' that contribute to the upper portions may also include silicon oxide. Alternatively, the first dielectric layers 210' may be formed of a material with good barrier properties (the material of the first dielectric layers 210' includes, for example, silicon nitride or the like). This can not only thicken the upper portions 200b' but also result in an additional reduction in gate-induced drain leakage current (GIDL).

Considering both Embodiments 1 and 2, it can be seen that, between the first and second dielectric layers, the material for the one that provides the lower portion and contributes to the upper portions may be selected, for example, as silicon oxide, while the material for the one that only contributes to the upper portions may be selected according to the actual needs (for example, as including silicon nitride and/or silicon oxide).

With continued reference to FIG. 3a, in this embodiment, the side surface portions of the gate trench 100a' higher than the first predetermined height level (the first height level H1) are recessed from the side surface portions of the gate trench 100a' lower than the first predetermined height level (the first height level H1). This can be interpreted as the presence of recesses defined by the side surface portions of the gate trench 100a' higher than the first predetermined height level (the first height level H1) and the side surface portions of the gate trench 100a' lower than the first predetermined height level (the first height level H1).

In this embodiment, the first dielectric layers 210' are formed in the respective recesses so as to cover the respective side surface portions of the gate trench 100a' higher than the first predetermined height level, and the second dielectric layer 220' covers the first dielectric layers 210' and the inner surface of the gate trench 100a' while conforming to the contour defined by both outer side surfaces of the first dielectric layers 210' and the inner surface portion of the gate trench 100a' lower than the first predetermined height level. In this way, the liner layers 210b' protrude from the lower portion 200a' toward the trench's inner surface.

It can be considered that, in this embodiment, a receptacle defined by the gate dielectric layer 200' in the gate trench 100a' may have side surfaces corresponding to outer side surfaces of the second dielectric layer 220', which are flat and smooth. A gate conductive layer 100' filled in the receptacle may have side surfaces conforming in geometry to the outer side surfaces of the second dielectric layer 220'.

A method of fabricating the transistor of this embodiment will be described in detail below. Specifically, in this method of fabricating the transistor of this embodiment, the gate trench is formed during the formation of the gate dielectric layer. The method will be detailed below with reference to FIGS. 4a to 4e, which are schematic illustrations of structures formed in the method of fabricating the transistor of Embodiment 2.

Figure 4A:
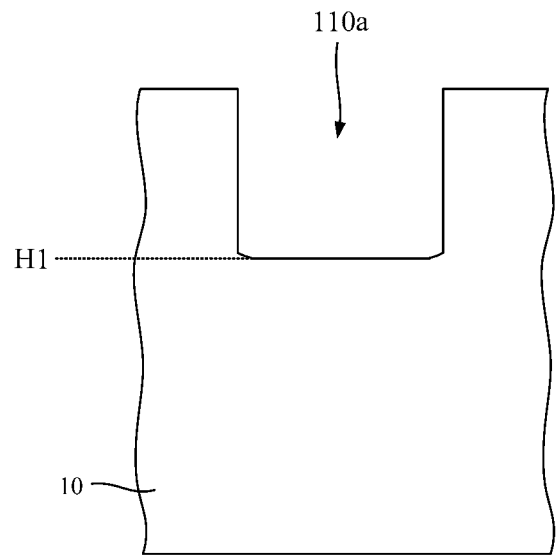
FIGS. 4a to 4e are schematic illustrations of structures formed in a method for fabricating the transistor of Embodiment 2 of the present invention.

At first, referring to FIG. 4a, a substrate 10 is provided, and a first trench 110a is formed in the substrate 10. The first trench 110a may have a bottom located at the first predetermined height level (the first height level H1).

Figure 4B:
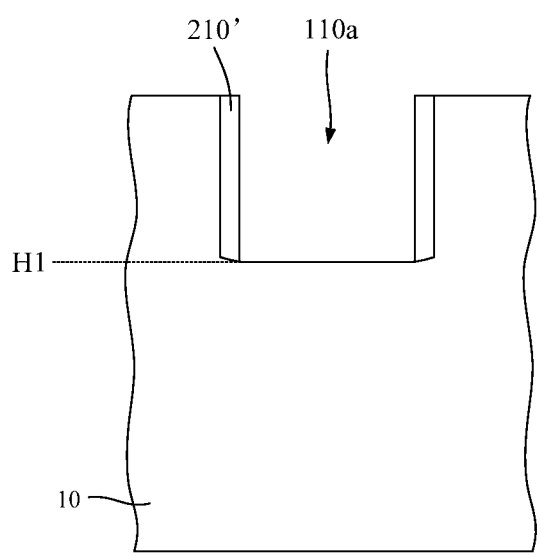

Referring to FIG. 4b, the first dielectric layers 210' are formed on respective side surfaces of the first trench 110a. As such, the first dielectric layers 210' are located above the first predetermined height level.

Figure 4C:
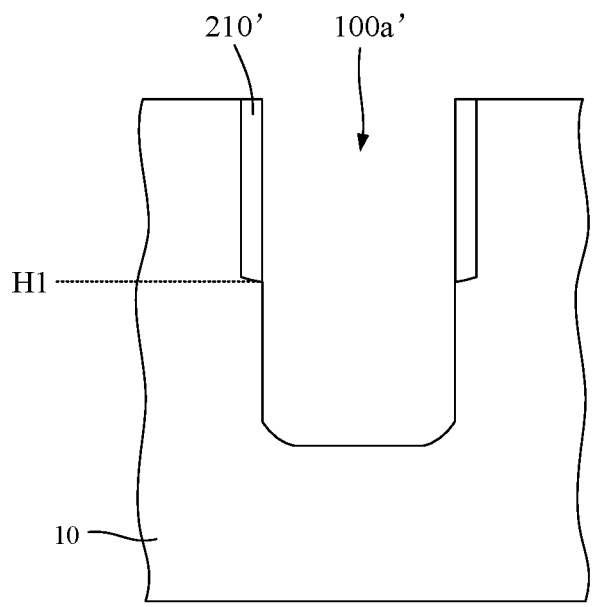

Referring to FIG. 4c, with the first dielectric layer 210' serving as masks, the substrate at the bottom of the first trench 110a is etched, resulting in the formation of a second trench under the first trench 110a and in communication therewith. That is, the second trench extends downward from the first predetermined height level and forms the gate trench 100a' together with the first trench 110a.

It is to be noted that, while not shown, in this embodiment, there is generally a mask layer over a top surface of the substrate 10 during the etching thereof for forming the first and second trenches, in order to protect other portions of the substrate from being undesirably etched away.

As shown in FIG. 4c, in this embodiment, side surfaces of the second trench of the gate trench 100a' continue smoothly with the respective outer side surfaces of first dielectric layer 210' to appear with them generally as flat surfaces. Moreover, the side surfaces of the second trench are stepped with respect to the respective side surfaces of the first trench 110a so that an opening size of the second trench is smaller than an opening size of the first trench 110a.

Figure 4D:
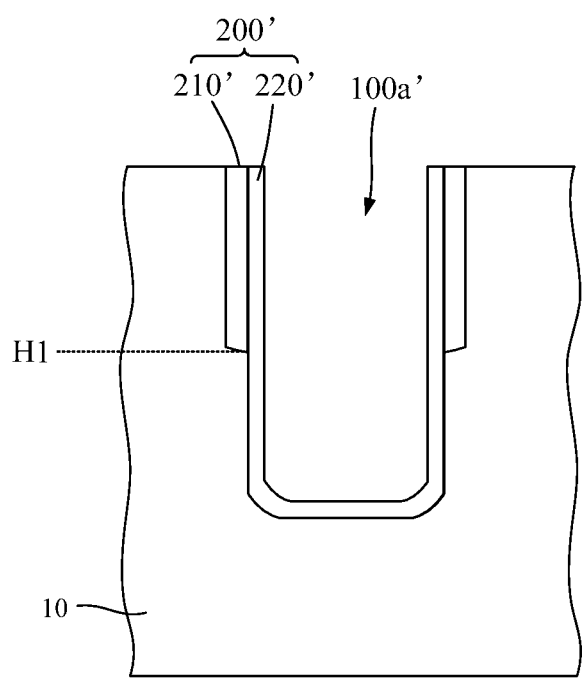

Referring to FIG. 4d, the second dielectric layer 220' is so formed in the gate trench 100a' as to cover both an inner surface of the second trench and the outer side surfaces of the first dielectric layer 210'.

The second dielectric layer 220' and the first dielectric layers 210' form the gate dielectric layer 200', with the first dielectric layers 210' forming the liner layers, and portions of the second dielectric layer 220' over the first dielectric layers 210' forming the cover layers, and a portion of the second dielectric layer 220' over the second trench's inner surface forming the lower portion.

Figure 4E:
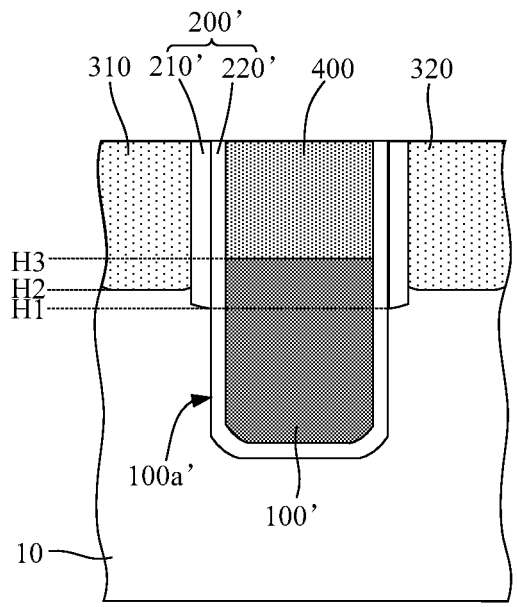

Referring to FIG. 4e, subsequent to the formation of the gate dielectric layer 200', the gate conductive layer 100' is filled in the gate trench 100a'. In this embodiment, the gate conductive layer 100' extends from the lower portion to the upper portions, with its side surfaces geometrically conforming to the respective side surfaces of the second dielectric layer 220'.

With similarity to Embodiment 1, the gate conductive layer 100' may have a top lower than top edges of the gate trench 100a'. Accordingly, subsequent to the formation of the gate conductive layer 100', the method may further include filling an insulating dielectric layer 400 in the space within the gate trench above the gate conductive layer.

In the above-discussed transistors, the gate dielectric layer has thicker upper portions, which separate the equally high portions of the gate conductive layer and the source/drain regions from one another, and a thinner lower portion, which separates the gate conductive layer from a portion of the substrate configured to provide a conductive channel. Separating the gate conductive layer from the substrate portion for providing a conductive channel with the thinner portion of the gate dielectric layer can ensure satisfactory performance of the transistors. Moreover, separating the gate conductive layer from the source/drain regions with the thicker portions of the gate dielectric layer can effectively mitigate gate-induced drain leakage current (GIDL).

Further, in these transistors, each upper portion of the gate dielectric layer is a multi-layer structure, which allows thickening the upper portions while maintaining the thickness of the lower portion as a conventional value. This can not only mitigate gate-induced drain leakage current (GIDL) at uncompromised transistor performance, but can also facilitate flexible adjustment in parameters of the upper portions, such as their thickness and material.

It should be recognized that, when employing the above transistors, a semiconductor device may have accordingly improved performance. The following description is given with the semiconductor device being a memory device as an example.

The memory device usually includes a memory array including a plurality of active areas, and transistors can be formed as memory cells in the active areas. Therefore, better performance of the transistors in the active areas can improve performance of the memory device. Specifically, the memory device may further include a plurality of word lines, which may intersect with the respective active areas, and the intersections may serve as gate conductive layers of the transistors.

Memory devices and methods of fabricating them proposed in the present invention will be described in greater detail below by way of specific embodiments with reference to the accompanying drawings. Advantages and features of the present invention will be more apparent from the following detailed description. Note that the figures are provided in a very simplified form not necessarily drawn to exact scale, and they are only intended to facilitate convenience and clarity in explaining the disclosed embodiments.

Embodiment 3

Figure 5:
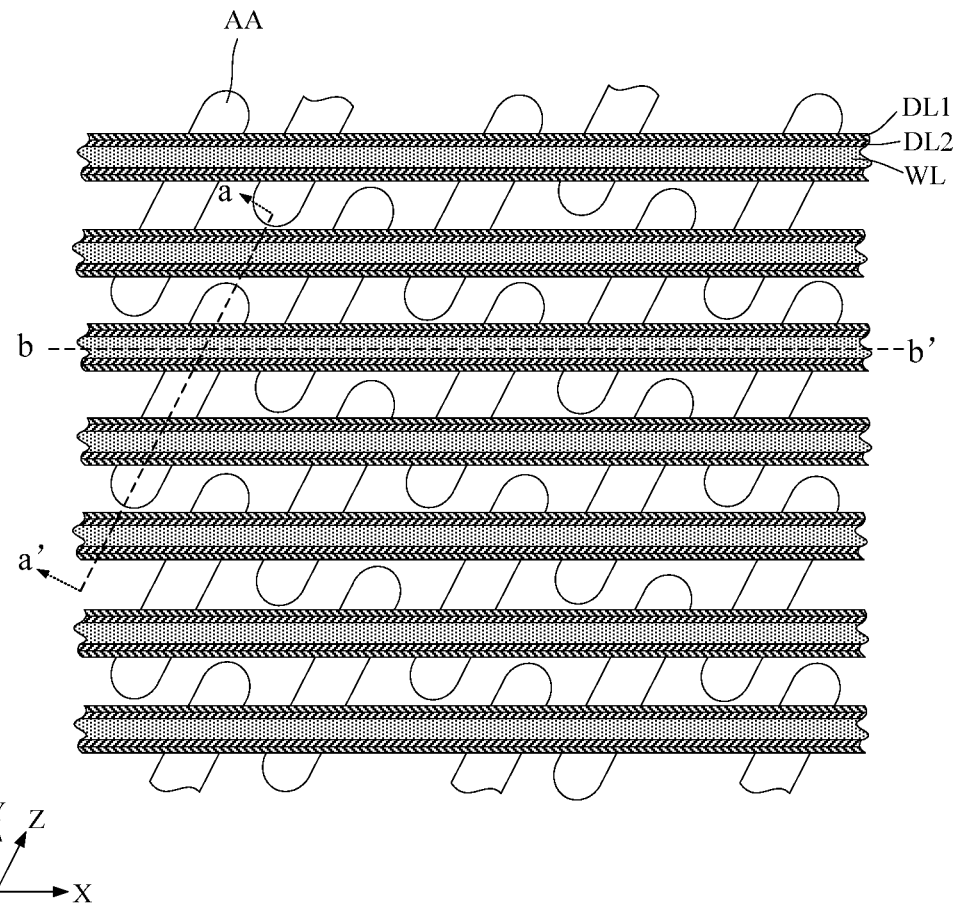
FIG. 5 is a top view of a memory device of Embodiment 3 of the present invention.
Figure 6A:
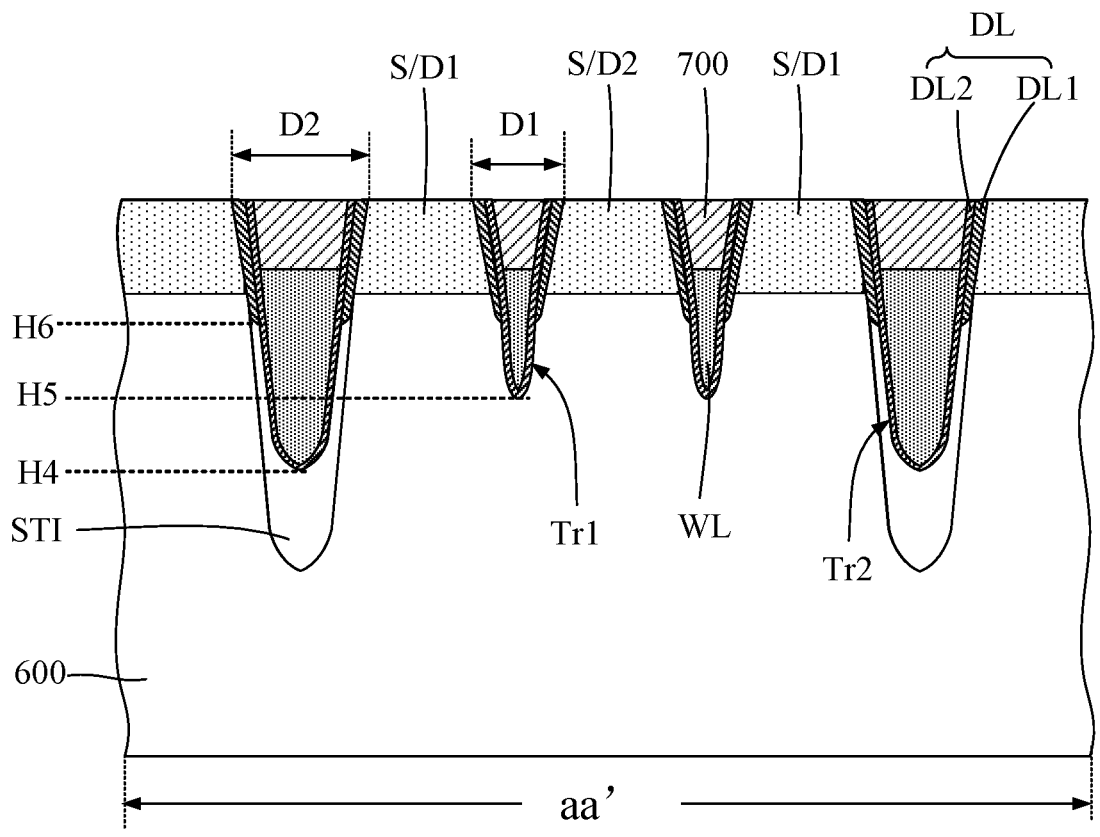
FIG. 6a is a schematic cross-sectional view of the memory device of Embodiment 3 of the present invention taken along line aa'.
Figure 6B:
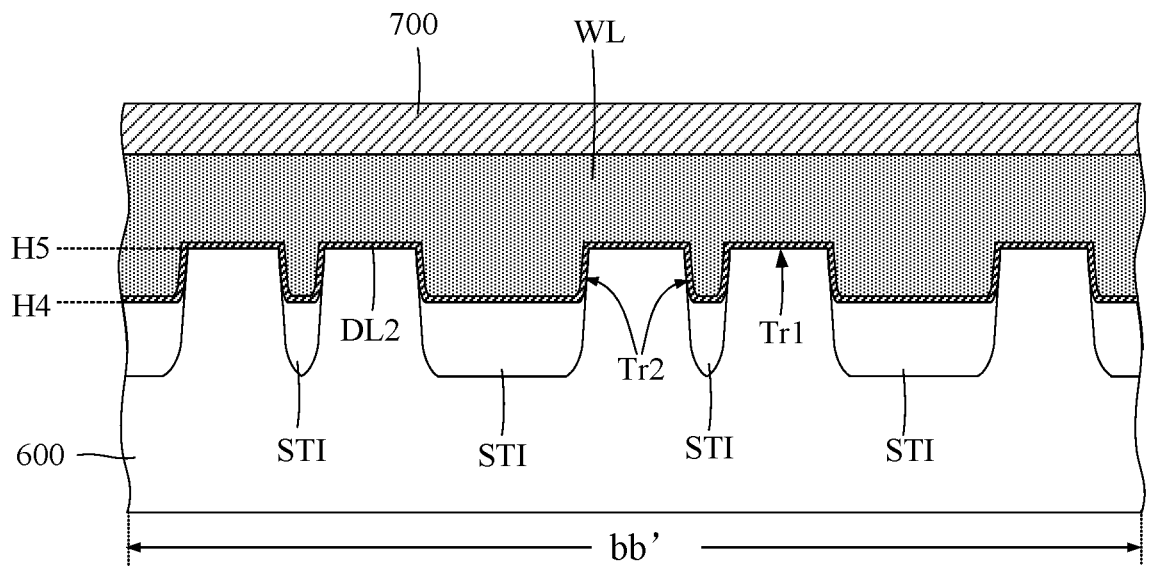
FIG. 6b is a schematic cross-sectional view of the memory device of Embodiment 3 of the present invention taken along line bb'.

FIG. 5 is a top view of a memory device according to Embodiment 3 of the present invention. FIG. 6a is a schematic cross-sectional view of the memory device according to Embodiment 3 of the present invention taken along line aa', and FIG. 6b is another schematic cross-sectional view of the memory device according to Embodiment 3 of the present invention taken along line bb'. As shown in FIGS. 5 and 6a to 6b, the memory device includes a substrate 600 and word lines WL formed on the substrate 600.

In the substrate 600, a plurality of active areas AA and trench isolation structures STI are formed, which separate adjacent active areas AA. The active areas AA are arranged in an array, and in order to avoid cross talk between the active areas AA, the active areas AA are individually isolated by the trench isolation structures STI.

Additionally, word line trenches in which the word lines WL are accommodated are formed in the substrate 600. Specifically, the word line trenches extend in a predetermined direction (X-direction) so that each of them traverses across corresponding ones of the active areas AA and corresponding ones of the trench isolation structures STI. Portions of the word line trenches in the active areas AA may form first trenches Tr1, and portions of the word line trenches in the trench isolation structures STI may form second trenches Tr2.

In this embodiment, the second trenches Tr2 may have an opening size D2 that is greater than an opening size D1 of the first trenches Tr1. Additionally, the second trenches Tr2 may have bottoms that are lower than bottoms of the first trenches Tr1. With particular reference to FIGS. 6a and 6b, the bottoms of the first trenches Tr1 may be located at a fifth height level H5, and the bottoms of the second trenches Tr2 may be located at a fourth height level H4, the fourth height level H4 is lower than the fifth height level H5.

With continued reference to FIGS. 5 and 6a to 6b, the memory device further includes dielectric material layers DL each covering an inner surface of a corresponding one of the word line trenches. Each dielectric material layer DL has upper portions and a lower portion, which both extend in the predetermined direction so that they cover both inner surfaces of the portions of the word line trench in the corresponding active areas AA and inner surfaces of the portions of the word line trench in corresponding trench isolation structures STI. Moreover, the upper portions have a thickness greater than a thickness of the lower portion. That is, the portions of the dielectric material layer DL in the corresponding active areas AA and trench isolation structures STI are all tapered downward (thick at the top and thin at the bottom).

In each dielectric material layer DL, the upper portions may cover, for example, inner surface portions of the respective word line trench higher than a second predetermined height level (i.e., the below-mentioned sixth height level H6), and the lower portion may cover, for example, an inner surface portion of the word line trench lower than the second predetermined height level.

As noted above, in this embodiment, the bottoms of the second trenches Tr2 may be lower than the bottoms of the first trenches Tr1. Therefore, bottoms of the portions of each dielectric material layer DL in the corresponding trench isolation structures STI may be lower than bottoms of the portions of the dielectric material layer DL in the corresponding active areas AA.

In addition, in this embodiment, bottoms of sections of the upper portions in the trench isolation structures STI are equally high to bottoms of sections of the upper portions in the active areas AA. However, it should be recognized that, in other embodiments, the bottoms of the sections of the upper portions in the trench isolation structures STI may also be lower than the bottoms of the sections of the upper portions in the active areas AA. In other words, the sections of the upper portions in the trench isolation structures STI may protrude downward from the sections of the upper portions in the active areas AA.

With continued reference to FIGS. 5 and 6a to 6b, the word lines WL are formed on the respective dielectric material layers DL and fills the respective word line trenches in such a manner that each word line WL extends from the lower portion to the upper portions of a respective one of the dielectric material layers DL. That is, each word line WL is located at the top higher than the second predetermined height level (the sixth height level H6).

As noted above, each of the word line trenches traverses in the predetermined direction across corresponding ones of the active areas AA and corresponding ones of the trench isolation structures STI. Accordingly, each of the word lines WL also intersects with corresponding ones of the active areas AA and corresponding ones of the trench isolation structures STI in the predetermined direction. In this embodiment, each word line WL has a lower bottom in each of the corresponding trench isolation structures STI than in each of the active areas AA, with each word line WL's top being kept at the same height level.

For example, memory transistors may be formed in the active areas AA, and in this case, the intersections between the word lines WL and the active areas AA may form gate conductive layers of the memory transistors.

In each of the active areas AA, source/drain regions including a first source/drain region S/D1 and a second source/drain region S/D2 may be further formed respectively on opposing sides of the respective word line WL, thus making up a memory transistor.

Each of the source/drain regions may have a bottom boundary lower than the top of the word line WL and higher than a bottom boundary of the upper portions. That is, a top portion of the word line WL is equally high to portions of the source/drain regions, and these equally high portions of the word line WL and source/drain regions are separated from one another by the thicker upper portions.

It is to be noted that since the word line WL extends from the lower portion to the upper portions, the word line WL is separated from the substrate 600 by the thinner lower portion at the bottom and the word line WL is separated from the substrate 600 by the thicker upper portions at the top. In particular, the top portion of the word line WL that is equally high to the portions of the source/drain regions allows enhanced isolation between the word line WL and the source/drain regions and reduced current leakage between the word line WL and the source/drain regions.

Specifically, each of the source/drain regions may have a side edge contiguous with a proximal side surface of the corresponding trench isolation structure STI. In this case, since the top portions of the word lines WL in the trench isolation structures STI correspond to the thicker upper portions, current leakage between the word lines WL in the trench isolation structures STI and the source/drain regions can be effectively reduced. In particular, in this embodiment, the second trenches Tr2 formed in the trench isolation structures STI have a larger opening size, shortening the gaps between the word lines WL in the trench isolation structures STI and the source/drain regions. Thus, thickening the portions of the dielectric material layers DL between the word lines WL and the source/drain regions can effectively mitigate current leakage therebetween.

In addition, in specific embodiments of the memory transistor, the thinner lower portion of the dielectric material layer DL separates the gate conductive layer (i.e., the word line WL) from a portion of the substrate configured to provide a conductive channel. The lower portion may be adapted to the actual needs to ensure satisfactory turn-on performance and saturation current performance of the memory transistor. As noted above, the upper portions of the dielectric material layer DL are at least disposed between the gate conductive layer and the source/drain regions. Since the upper portions are relatively thick, they can effectively mitigate gate-induced drain leakage current (GIDL) and increase current leakage resistance of the memory transistor, resulting in enhanced overall performance thereof. Thus, the memory transistor of this embodiment suffers from reduced gate-induced drain leakage current (GIDL) and enables improved overall performance of the memory device while not compromising its turn-on performance and saturation current performance.

In the memory device of this embodiment, the upper and lower portions of the dielectric material layers DL extend continuously in the direction of extension of the word lines, so that the trench isolation structures STI and active areas AA all have downward-tapered portions of the dielectric material layers DL. This can mitigate current leakage of the word lines WL in the trench isolation structures STI and active areas AA, resulting in a significant improvement in the memory device's performance.

Further, portions of the lower portion of each dielectric material layer DL in the corresponding active areas may form first lower portions, and portions of the lower portion of the dielectric material layer DL in the corresponding trench isolation structures may form second lower portions. The first lower portions may have a thickness that is different from a thickness of the second lower portions. Furthermore, the thickness of the first lower portions may be greater than the thickness of the second lower portions. This ensures sufficiently thick dielectric material layers for conductive channel regions of the memory transistors in the memory device and hence satisfactory performance of the memory transistors.

With continued reference to FIGS. 6a and 6b, each dielectric material layer DL may be a multi-layer structure, and the thickness of the dielectric material layer DL may be adjusted by changing the thicknesses of individual layers in the multi-layer structure.

Specifically, each dielectric material layer DL may include first dielectric layers DL1 on the inner surface of the corresponding word line trench and a second dielectric layer DL2 over the first dielectric layers DL1. The first dielectric layers DL1 may cover portions of the inner surface of the word line trench higher than the second predetermined height level (the sixth height level H6), and the second dielectric layer DL2 may cover both the first dielectric layers DL1 and a portion of the inner surface of the word line trench lower than the second predetermined height level. In this case, a portion of the second dielectric layer DL2 lower than the second predetermined height level may form the lower portion, and portions of the second dielectric layer DL2 higher than the second predetermined height level may form the upper portions together with the first dielectric layers DL1. In this embodiment, the upper portions may protrude from the lower portion toward the trench's inner surface.

It would be appreciated that, in this embodiment, since the lower portion of each dielectric material layer DL is provided by the second dielectric layer DL2, and since each upper portion of the dielectric material layer DL is a stack of a portion of the second dielectric layer DL2 and one of the first dielectric layers DL1, the upper portions are thickened. That is, each upper portion has a thickness that is the sum of those of the first and second dielectric layers DL1, DL2, while the lower portion has a thickness equal to that of the second dielectric layer DL2.

It should be recognized that the thickness of the first dielectric layers DL1 may be adapted as actually needed without affecting the thickness of the second dielectric layer DL2. For example, the first dielectric layers DL1 may each have a thickness in the direction perpendicular to the trench's side surfaces, which is greater than or equal to a thickness of the second dielectric layer DL2 in the direction perpendicular to the trench's side surfaces. In this way, flexible adjustment in the thickness of the upper portions is made possible.

The first and second dielectric layers DL1, DL2 may be both formed by a deposition process and a thermal oxidation process. In this way, each of the first and second dielectric layers DL1, DL2 may be made to have different thicknesses in the active areas AA and in the trench isolation structures STI. For instance, in this embodiment, the second dielectric layer DL2 may be made to have different thicknesses in the active areas AA and in the trench isolation structures STI. That is, the first lower portions of the lower portion in the active areas AA may have a thickness different from that of the second lower portions in the trench isolation structures STI. Moreover, the second dielectric layer DL2 may be made to have a thickness in the active areas AA, which is greater than a thickness of the second dielectric layer DL2 in the trench isolation structures STI.

The first and second dielectric layers DL1, DL2 may be made of the same material including, for example, silicon oxide. Of course, they may also be made of different materials. Specifically, the second dielectric layer DL2 that provides the lower portion and contributes to the upper portions may be made of a material including silicon oxide. Moreover, the first dielectric layers DL1 that contribute to the upper portions may be made of a material also including silicon oxide. Alternatively, the first dielectric layers DL1 may also be made of a material with good barrier properties (which includes, for example, silicon nitride or the like). This can not only thicken the upper portions, but also result in an additional reduction in current leakage.

With continued reference to FIGS. 6a and 6b, in this embodiment, of each word line trench, a portion higher than the second predetermined height level (i.e., the sixth height level H6) may form an upper trench, and the remainder lower than the second predetermined height level may form a lower trench. In this case, the first dielectric layers DL1 cover side surfaces of the upper trench, and the second dielectric layer DL2 covers both outer side surfaces of the first dielectric layers DL1 (i.e., the side surfaces of the first dielectric layers DL1 away from the respective side surfaces of the upper trench) and an inner surface of the lower trench.

Additionally, in the word line trench, the upper trench may have an opening size greater than an opening size of the lower trench, and portions of the word line trench where the upper trench is joined to the lower trench may define shoulders. It would be appreciated that, in this embodiment, the shoulders are formed in the portions where the upper trench is joined to the lower trench because the side surfaces of the upper trench are recessed from the respective side surfaces of the lower trench toward each other.

Moreover, the first dielectric layers DL1 may reside on the respective shoulders, with the outer side surfaces of the first dielectric layers DL1 smoothly continuing with the respective side surfaces of the lower trench to appear with them generally as flat surfaces. The second dielectric layer DL2 may cover the first dielectric layers DL1 and the inner surface of the lower trench while conforming to the contour defined by both the outer side surfaces of the first dielectric layers DL1 and the inner surface of the lower trench. Accordingly, side surfaces of the word line WL filled in the word line trench may also conform to the contours of outer side surfaces of the second dielectric layer DL2 (i.e., the side surfaces of the second dielectric layer DL2 away from the trench's respective side surfaces) and appear as flat, smooth surfaces.

With continued reference to FIGS. 6a and 6b, the top of the word line WL may be lower than top edges of the word line trench, and an insulating dielectric layer 700 may be filled in the space within the word line trench above the word line WL so as to reside on the word line WL.

A method of fabricating the memory device of this embodiment will be described in detail below. Specifically, in this method of fabricating the memory device of this embodiment, the dielectric material layers are formed during the formation of the word line trenches. The following detailed description is set forth with reference to FIGS. 7a to 7f, which are schematic illustrations of structures formed in the method of fabricating the memory device of Embodiment 3.

Figure 7A:
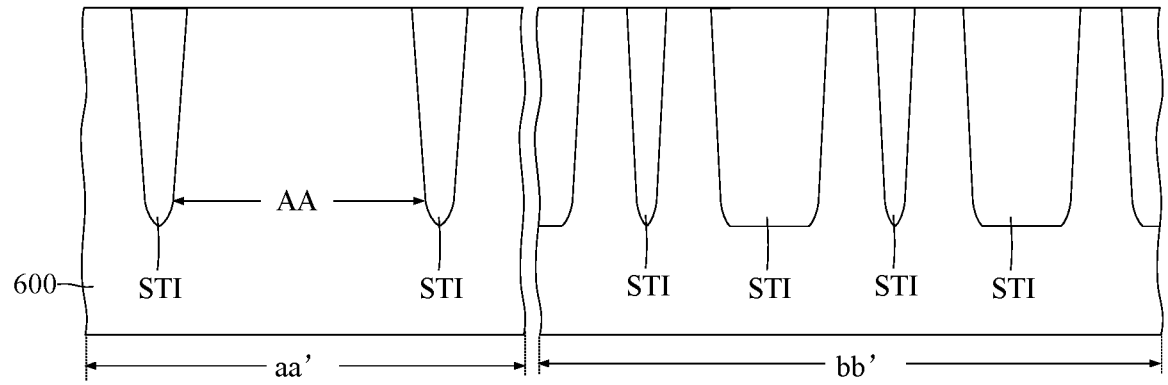
FIGS. 7a to 7f are schematic illustrations of structures formed in a method for fabricating the memory device of Embodiment 3 of the present invention.

At first, referring to FIG. 7a, the substrate 600 is provided, in which trench isolation structures STI delimiting a plurality of active areas AA are formed.

Figure 7B:
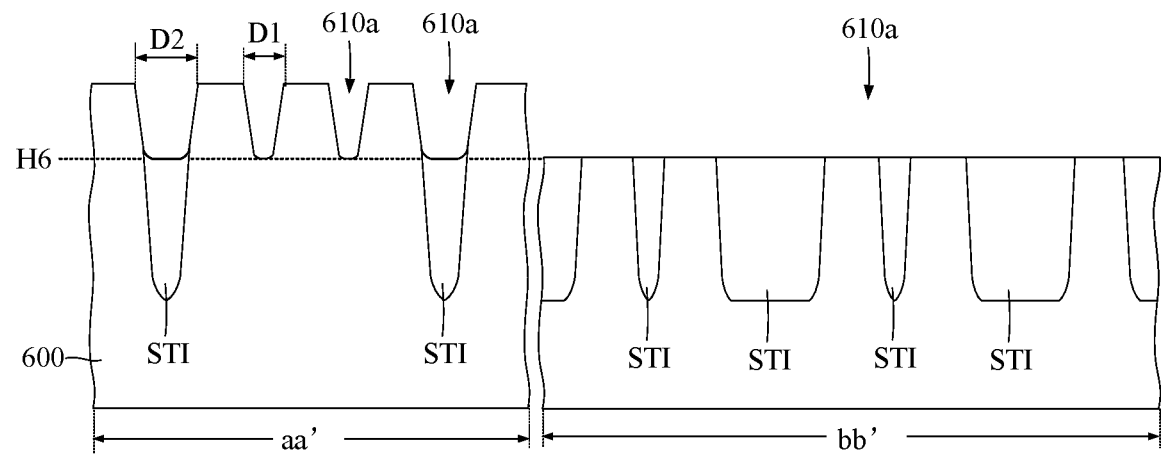

Referring to FIG. 7b, upper trenches 610a are formed in the substrate 600, the upper trenches 610a have bottoms located at the second predetermined height level (i.e., the sixth height level H6).

As detailed below, the upper trenches 610a are formed as part of the word line trenches. Therefore, each of the upper trenches 610a extends in the predetermined direction across corresponding ones of the active areas AA and corresponding ones of the trench isolation structures STI. Additionally, the upper trenches 610a have an opening size D1 in the active areas AA, which is smaller than an opening size D2 of the upper trenches 610a in the trench isolation structures STI.

Figure 7C:
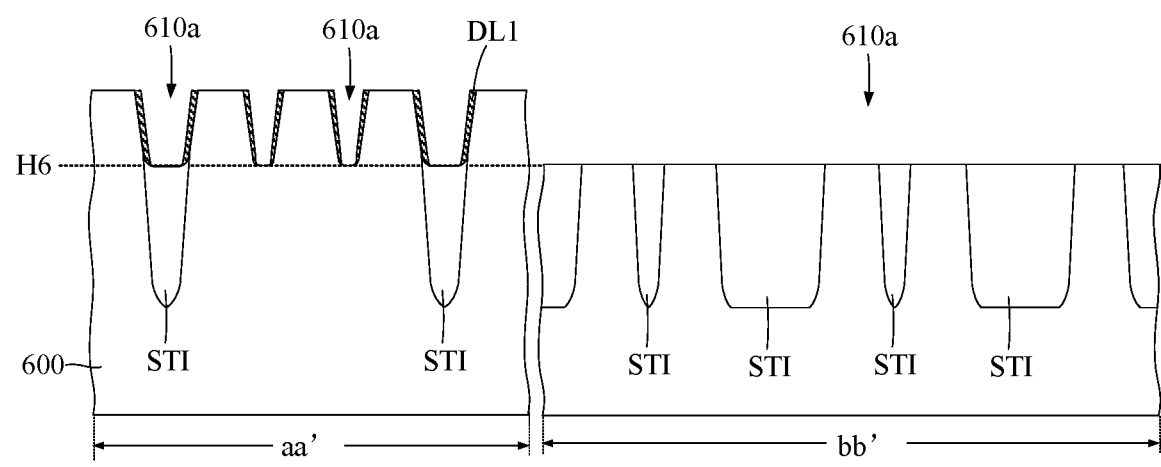

Referring to FIG. 7c, the first dielectric layers DL1 are formed over side surfaces of the respective upper trenches 610a. Accordingly, the first dielectric layers DL1 are located above the second predetermined height level. The formation of the first dielectric layers DL1 may be accomplished by a deposition process, in particular, an atomic layer deposition (ALD) process.

Figure 7D:
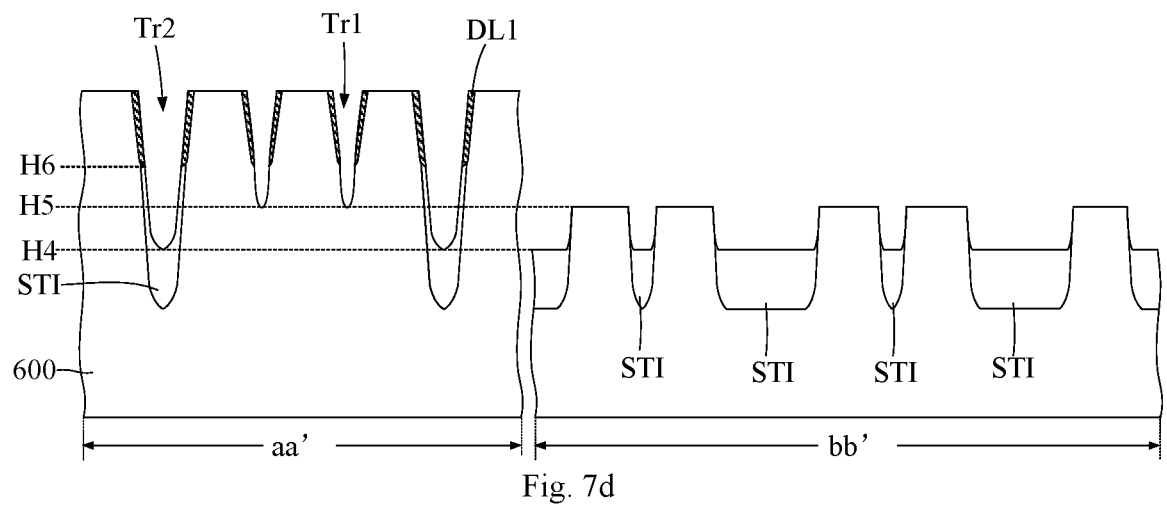

Referring to FIG. 7d, with the first dielectric layers DL1 serving as masks, the substrate is etched at the bottoms of the upper trenches 610a, resulting in the formation of the lower trenches under the respective upper trenches 610a and in communication therewith. That is, the lower trenches extend downward from the second predetermined height level (the sixth height level H6), with their side surfaces smoothly continuing with outer side surfaces of the first dielectric layer DL1 (i.e., the exposed side surfaces of the first dielectric layers DL1, as shown in FIG. 3d) so as to appear therewith generally as flat surfaces. As a result, shoulders are formed where the lower trenches are joined to the upper trenches 610a, and the lower trenches have an opening size smaller than an opening size of the upper trenches 610a.

Additionally, the lower trenches have a bottom located at the fourth height level H4 in the trench isolation structures STI and a bottom located at the fifth height level H5 in the active areas AA. The fourth height level H4 is lower than the fifth height level H5.

In this embodiment, the lower trenches and the upper trenches 610a form the word line trenches, with portions of the word line trenches in the active areas AA forming the first trenches Tr1 and portions of the word line trenches in the trench isolation structures STI forming the second trenches Tr2. Thus, the second trenches Tr2 have bottoms lower than bottoms of the first trenches Tr1.

It is to be noted that, while not shown, in this embodiment, there is generally a mask layer over a top surface of the substrate 600 during the etching thereof for forming the upper and lower trenches, in order to protect other portions of the substrate from being undesirably etched away.

Figure 7E:
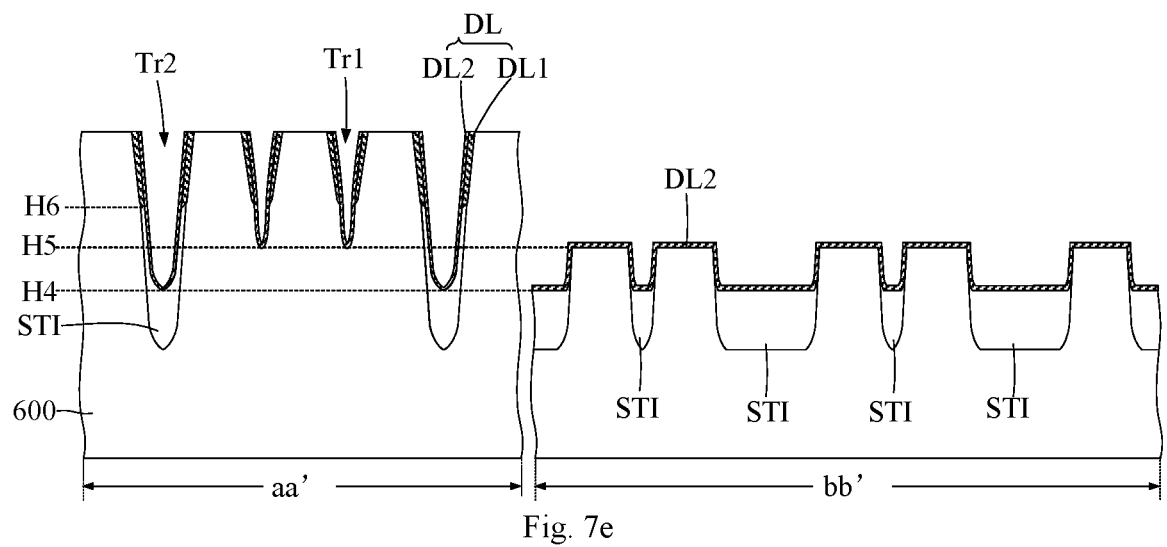

Referring to FIG. 7e, the second dielectric layers DL2 are formed in the respective word line trenches so that each of the second dielectric layers DL2 covers both the inner surface of the lower trench of the respective word line trench and the outer side surfaces of the first dielectric layers DL1 therein. As a result, the second dielectric layers DL2 and the first dielectric layers DL1 form the dielectric material layers DL.

Moreover, portions of the second dielectric layers DL2 over the first dielectric layers DL1 form the upper portions together with the first dielectric layers DL1, and portions of the second dielectric layers DL2 over the inner surfaces of the lower trenches form the lower portions.

In this embodiment, the formation of the second dielectric layers DL2 may include a deposition process and a thermal oxidation process. Specifically, the deposition process (e.g., an atomic layer deposition process) may be performed first to deposit the dielectric material into the first and second trenches Tr1, Tr2. The thermal oxidation process (e.g., an in-situ steam generation oxidation (ISSG) process) may follow to densify the dielectric material.

It is to be noted that, for the trench isolation structures STI, in addition to the densification of the deposited dielectric material, the thermal oxidation process (e.g., an ISSG process) can also densify the insulating material and relieve internal stress in the trench isolation structures STI. In this way, isolation performance of the trench isolation structures STI can be improved, resulting in an additional reduction in current leakage. Moreover, for the active areas AA, the thermal oxidation process can not only densify the dielectric material and increase its dielectric constant, but can also oxidize the substrate at the inner surfaces of the word line the trenches with oxygen radicals and thus thicken the second dielectric layers DL2 in the active areas AA, which is favorable to the performance of the memory transistors being fabricated.

Figure 7F:
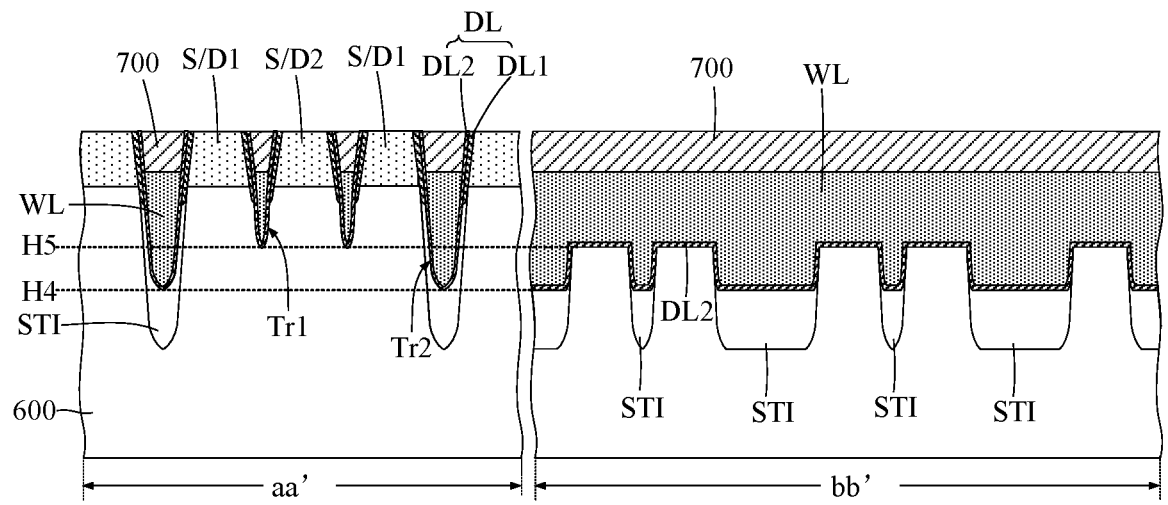

Referring to FIG. 7f, the word lines WL are formed in the respective word line trenches. Specifically, tops of the word lines WL are higher than the second predetermined height level (the sixth height level H6) so that the word lines WL extend from the lower portions to the upper portions, with their side surfaces conforming to the side surfaces of the second dielectric layers DL2. The word line WL may be made of a material including, for example, polysilicon, tungsten or the like.

In this embodiment, the tops of the word lines WL may be lower than the top surface of the substrate 600. That is, the word lines WL may not fill up the word line trenches. Specifically, for example, an etch-back process may be employed to lower the tops of the word lines WL in the word line trenches to a level lower than the top surface of the substrate 600.

Additionally, with continued reference to FIG. 7f, the method of fabricating the memory device may further include filling the insulating dielectric layers 700 in the spaces in the word line trenches higher than the word lines WL so that the insulating dielectric layers 700 reside on the respective word lines WL. The insulating dielectric layers 700 may be made of a material including, for example, silicon nitride.

With continued reference to FIG. 7f, the method of fabricating the memory device may further include forming the source/drain regions in the substrate 600, each having a side boundary contiguous with a top portion of a proximal side surface of a corresponding one of the word line trenches and a bottom boundary lower than the tops of the word lines WL and higher than the second predetermined height level (the sixth height level H6). In this way, the source/drain regions and the word lines WL have equally high portions which are separated from one another by the upper portions of the dielectric material layers DL.

Specifically, the source/drain regions may include first source/drain regions S/D1 and second source/drain regions S/D2, which are situated on opposing sides of the word lines WL. In this embodiment, each first source/drain region S/D1 may have a side boundary contiguous with a proximal side surface of a corresponding one of the trench isolation structures STI.

It is to be noted that, in this embodiment, the source/drain regions are formed after the word line trenches and the word lines WL have been formed. However, in other embodiments, the formation of the source/drain regions may precede the formation of the word line trenches and the word lines WL.

Embodiment 4

Figure 8A:
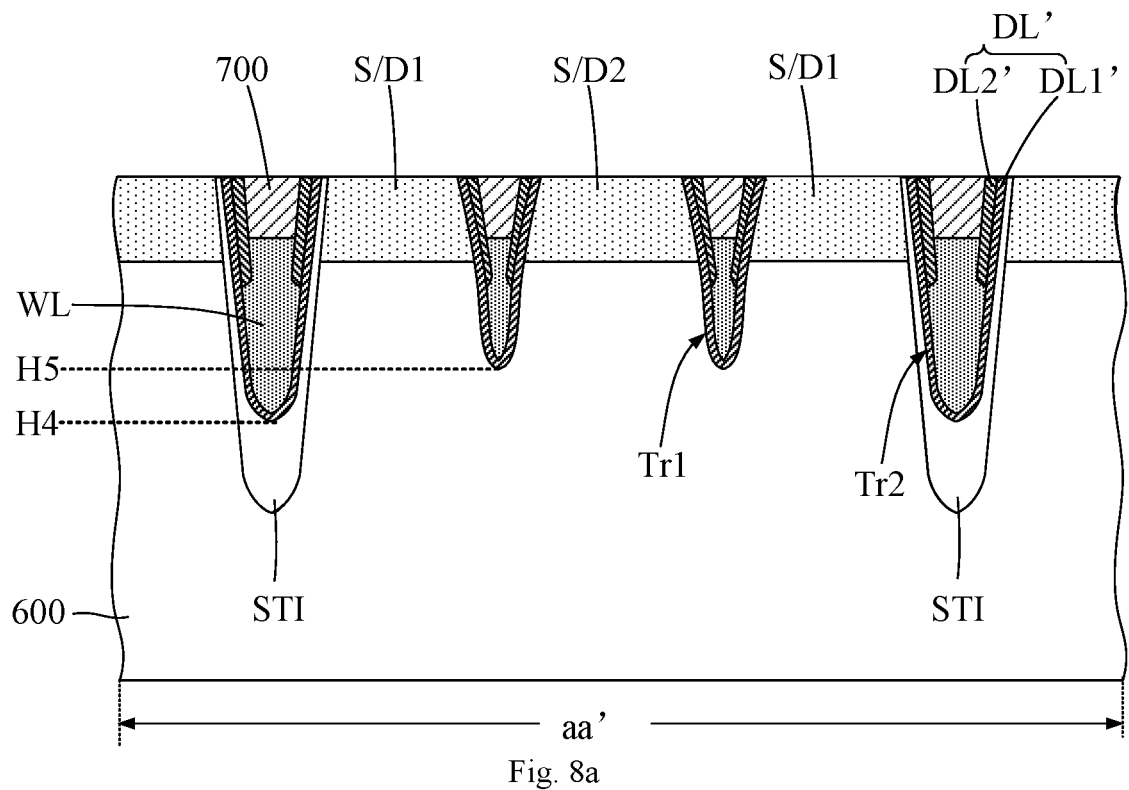
FIG. 8a is a schematic cross-sectional view of the memory device of Embodiment 4 of the present invention taken along line aa'.

Differing from Embodiment 3, in each dielectric material layer according to this embodiment, the upper portions protrude from the lower portion away from the inner surface of the trench. A memory device of Embodiment 4 will be described in detail below with reference to FIGS. 8a and 8b. FIG. 8a is a schematic cross-sectional view of the memory device of Embodiment 4 of the present invention taken along line aa', and FIG. 8b is another schematic cross-sectional view of the memory device of Embodiment 4 of the present invention taken along line bb'.

Figure 8B:
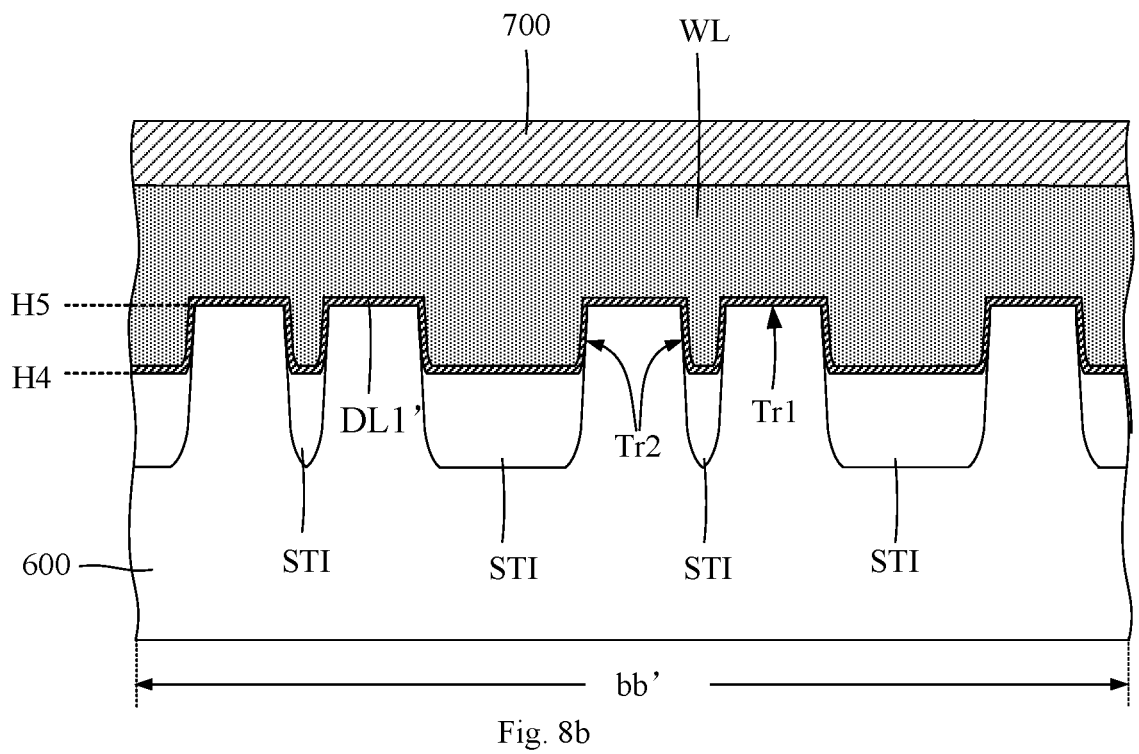
FIG. 8b is a schematic cross-sectional view of the memory device of Embodiment 4 of the present invention taken along line bb'.

With combined reference to FIGS. 8a and 8b, in this embodiment, each dielectric material layer DL' includes a first dielectric layer DL1' and second dielectric layers DL2'. The first dielectric layer DL1' covers the inner surface of the respective word line trench, with a portion of the first dielectric layer DL1' lower than the second predetermined height level (i.e., the sixth height level H6) forming the lower portion of the dielectric material layer DL'. The second dielectric layers DL2' cover respective portions of the first dielectric layer DL1' higher than the second predetermined height level. In addition, the portions of the first dielectric layer DL1' higher than the second predetermined height level may form the upper portions of the dielectric material layer DL' together with the second dielectric layers DL2'.

It would be appreciated that, in this embodiment, the lower portion of the dielectric material layer DL' is provided by the first dielectric layer DL1', while each upper portion of the dielectric material layer DL' is made up of a portion of the first dielectric layer DL1' and one of the second dielectric layers DL2'. In this way, the upper portions are thickened. It should be recognized that the thickness of the second dielectric layers DL2' may be adapted as actually needed without affecting the thickness of the first dielectric layer DL1'. For example, the second dielectric layers DL2' may each have a thickness in the direction perpendicular to the trench's side surfaces, which is greater than or equal to a thickness of the first dielectric layer DL1' in the direction perpendicular to the trench's side surfaces.

As noted above, the first and second dielectric layers DL1', DL2' may be made either of the same material or of different materials. In this embodiment, the material of the first dielectric layer DL1' that provides the lower portion and contributes to the upper portions may include, for example, silicon oxide (SiO). The material of the second dielectric layers DL2' that contribute to the upper portions may be selected according to the actual needs. Specifically, the second dielectric layers DL2' may be made of the same material as the first dielectric layer DL1'. In this case, the upper portions are thickened portions of the homogeneous material. Alternatively, the second dielectric layers DL2' may be formed of a material with good barrier properties (which includes, for example, silicon nitride or the like). This can not only thicken the upper portions but also result in an additional reduction in current leakage.

Moreover, in this embodiment, the first and second dielectric layers DL1', DL2' may be both formed by a deposition process and a thermal oxidation process. In this way, each of the first and second dielectric layers DL1', DL2' may be made to have different thicknesses in the active areas AA and in the trench isolation structures STI. Specifically, in this embodiment, the first dielectric layer DL1' may be made to have different thicknesses in the active areas AA and in the trench isolation structures STI. That is, the first lower portions of the lower portion in the active areas AA may have a thickness different from that of the second lower portions in the trench isolation structures STI. Moreover, the first dielectric layer DL1' may be made to have a thickness in the active areas AA, which is greater than a thickness thereof in the trench isolation structures STI.

As can be seen from Embodiment 3 and Embodiment 4, between the first and second dielectric layers, the one that provides the lower portion and contributes to the upper portions may be made of, for example, silicon oxide, and have different thicknesses in the active areas AA and in the trench isolation structures STI (for example, it may have a greater thickness in the active areas than in the trench isolation structures), while the material for the one that only contributes to the upper portions may be adapted to the actual needs (for example, as including silicon nitride and/or silicon oxide). Of course, the dielectric layer that only contributes to the upper portions may also have different thicknesses in the active areas and in the trench isolation structures.

Additionally, the word line trench may have flat, smooth side surfaces, and the first dielectric layer DL1' may so cover the inner surface of the word line trench as to conform to the contour thereof. The second dielectric layers DL2' may reside on outer side surfaces of the first dielectric layer DL1' (i.e., side surfaces thereof away from the respective side surfaces of the word line trench). As such, the upper portions protrude from the lower portion away from the trench's inner surface.

Accordingly, the word line WL filled in the word line trench has a reduced size in a top portion. Specifically, the word line WL may have first side surfaces contiguous with the first dielectric layer DL1' and second side surfaces contiguous with the second dielectric layer DL2'. In this way, shoulders may be formed where the first side surfaces are joined to the respective second side surfaces.

With continued reference to FIGS. 8a and 8b, similar to Embodiment 1, the word line WL may have a top lower than top edges of the word line trench, and the insulating dielectric layer 700 may be formed in the space in the word line trench above the word line WL so as to reside on the word line WL.

A method of fabricating the memory device of this embodiment will be described in detail below. Specifically, in this method of fabricating the memory device of this embodiment, the dielectric material layers are formed subsequent to the formation of the word line trenches. The following detailed description is set forth with reference to FIGS. 9a to 9e, which are schematic illustrations of structures formed in the method of fabricating the memory device of Embodiment 4 of the present invention.

Figure 9A:
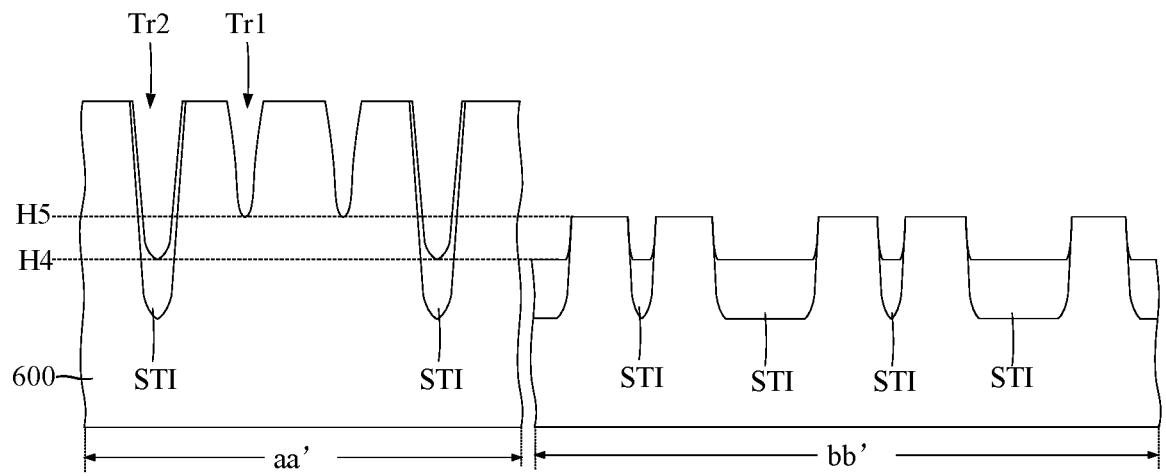
FIGS. 9a to 9e are schematic illustrations of structures formed in a method for fabricating the memory device of Embodiment 4 of the present invention.

First of all, referring to FIG. 9a, the substrate 600 is provided, and the word line trenches are formed in the substrate 600. The word line trenches extend in a predetermined direction (i.e., the direction of extension of corresponding word lines) across the active areas AA and the trench isolation structures STI.

As noted above, in the word line trenches, the second trenches Tr2 have bottoms lower than bottoms of the first trenches Tr1.

Figure 9B:
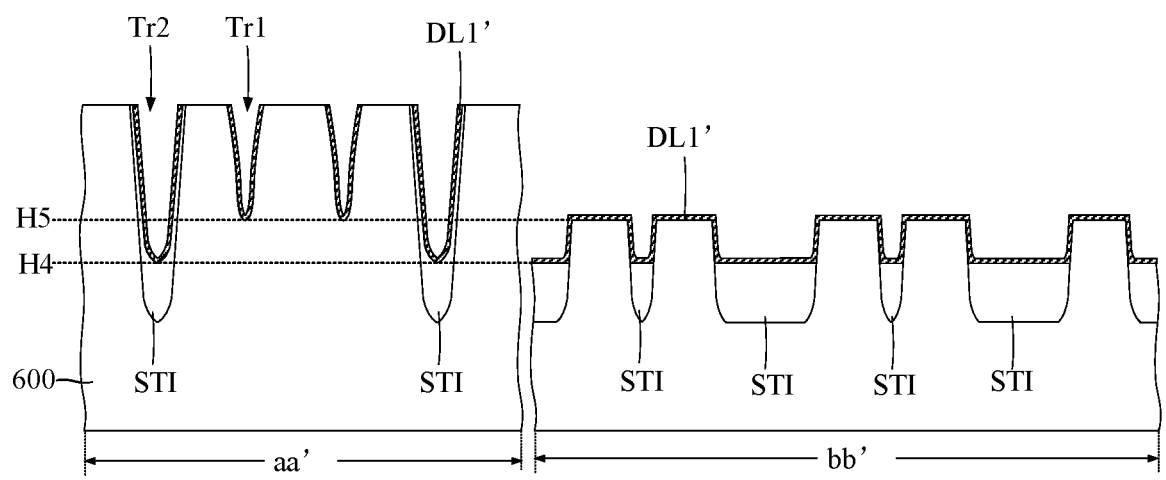

Referring to FIG. 9b, the first dielectric layers DL1' are formed on the inner surfaces of the word line trenches. The first dielectric layers DL1' may be made of a material including, for example, silicon oxide.

Additionally, the formation of the first dielectric layers DL1' may be accomplished, for example, by a deposition process and a thermal oxidation process. Further, in order for the first dielectric layers DL1' to have an increased dielectric constant, the thermal oxidation process may include, for example, an in-situ steam generation (ISSG) oxidation process.

It is to be noted that, in this embodiment, forming the first dielectric layers DL1' by the deposition and thermal oxidation processes can allow the first dielectric layers DL1' to have different thicknesses in the active areas AA and in the trench isolation structures STI. Specifically, the thermal oxidation process can densify both the first dielectric layers DL1' and the insulating material of the trench isolation structures STI and oxidize the substrate at the inner surfaces of the word line the trenches in the active areas AA. As a result, the first dielectric layers DL1' have a greater thickness in the active areas AA than in the trench isolation structures.

Moreover, in this embodiment, during the formation of the first dielectric layer DL1' on the inner surfaces of the respective word line trenches, a dielectric layer will be formed also on the top surface of the substrate 600.

It is to be noted that portions of the first dielectric layers DL1' lower than the second predetermined height level form the lower portions of the dielectric material layers DL'. In the active areas AA, the lower portions separate the gate conductive layers from the conductive channels in the memory transistors. Therefore, the thickness of the first dielectric layers DL1' may be selected according to the desired performance of the memory transistors being fabricated.

Figure 9C:
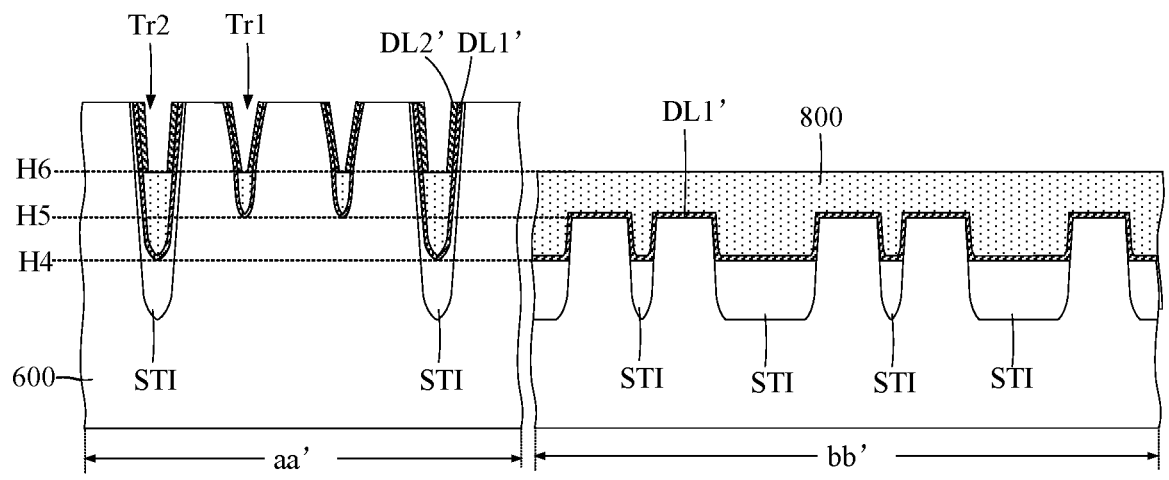

Referring to FIG. 9c, sacrificial layers 800 are filled in the respective word line trenches. The sacrificial layers 800 extend from the bottoms of the word line trenches up to the second predetermined height level (the sixth height level H6). That is, the sacrificial layers 800 cover portions of the first dielectric layers DL1' lower than the second predetermined height level, with outer side surface portions of the first dielectric layers DL1' higher than the sacrificial layers remaining exposed.

The sacrificial layers 800 may be made of a material including, for example, an organic material. For example, the formation of the sacrificial layers 800 may include: filling the organic material into the word line trenches by a spin-coating process; and then performing an etch-back process to lower a top surface of the organic material in the word line trenches down to the second predetermined height level, thereby obtaining the sacrificial layers 800.

With continued reference to FIG. 9c, the second dielectric layers DL2' are formed on the respective exposed outer side surface portions of the first dielectric layer DL1', i.e., outer side surface portions of the first dielectric layer DL1' higher than the second predetermined height level.

The first and second dielectric layers DL1', DL2' together form the dielectric material layer DL', with the portions of the first dielectric layer DL1' lower than the second predetermined height level forming the lower portion, and the portions of the first dielectric layer DL1' higher than the second predetermined height level serving as the upper portions together with the second dielectric layer DL2'.

Additionally, the second dielectric layers DL2' may be made of the same material as the first dielectric layer DL1', which may include, for example, silicon oxide. The formation of the second dielectric layer DL2' may be accomplished by, for example, chemical vapor deposition or atomic layer deposition.

Figure 9D:
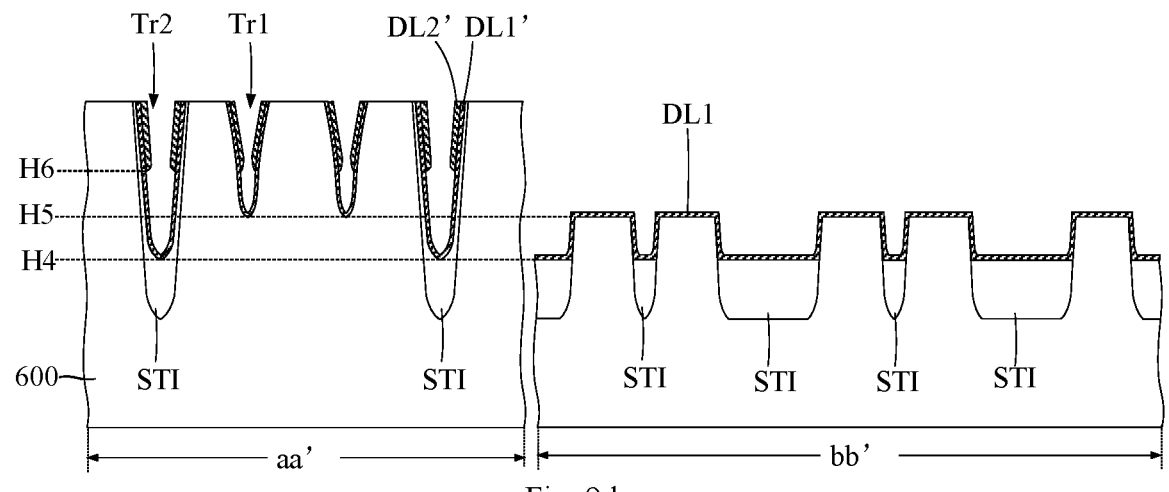

Referring to FIG. 9d, the sacrificial layers 800 may be removed, exposing the portions of the first dielectric layer DL1' lower than the second predetermined height level.

Thus, in the dielectric material layers DL' of this embodiment, the lower portions are provided by the first dielectric layers DL1', and the upper portions are made up of portions of the first dielectric layer DL1' and the second dielectric layer DL2'. As a result, the upper portions protrude from the lower portions away from the trench's inner surfaces.

Figure 9E:
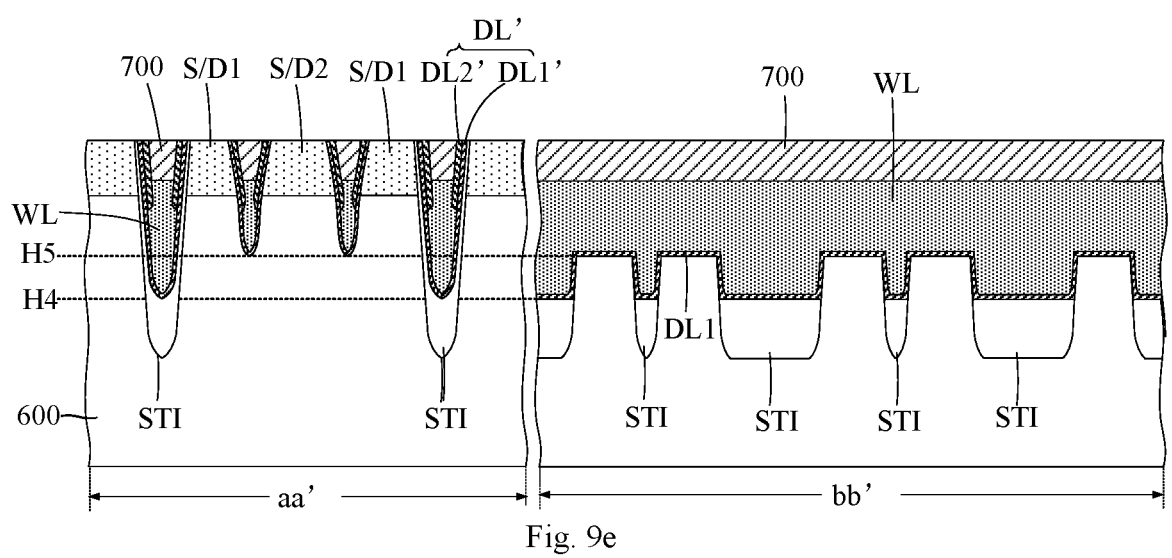

Referring to FIG. 9e, the word lines WL are formed in the respective word line trenches. With similarity to Embodiment 3, the word lines WL may have tops lower than top edges of the word line trenches. Accordingly, after the formation of the word lines WL, the insulating dielectric layers 700 may be filled in the spaces of the respective word line trenches above the word lines.

In summary, in the memory devices of the above embodiments, the dielectric material layers have thicker upper portions and a thinner lower portion. The upper portions separate equally high portions of the word lines and the source/drain regions from one another, resulting in improve current leakage resistance of the memory devices.

Specifically, for the isolation areas (corresponding to the trench isolation structures), side boundaries of the source/drain regions in the active areas are contiguous with the trench isolation structures, and equally high portions of the word lines in the trench isolation structures and the source/drain regions are separated from one another by the thicker upper portions. In this way, current leakage between the word lines in the isolation areas and the source/drain regions.

Likewise, for the active areas, equally high portions of the word lines and source/drain regions are separated from one another by the thicker upper portions, and the word lines are separated from substrate portions for providing conductive channels by the thinner lower portions. As such, on the one hand, since the word lines are separated from the substrate portions for providing conductive channels by thin dielectric material layer portions as practiced conventionally, satisfactory performance of the memory transistors can be ensured. On the other hand, since the word lines are separated from the source/drain regions by thickened dielectric material layer portions, gate-induced drain leakage current (GIDL) can be significantly mitigated.

Further, in the above memory devices, the dielectric material layers are multi-layer structures, which have an increased thickness in the upper portions and a conventional thickness in the lower portions. This can not only achieve uncompromised performance of the memory transistors and mitigated gate-induced drain leakage current (GIDL), but also facilitates flexible adjustment in parameters of the upper portions, such as their thickness and material.

It is noted that the embodiments disclosed herein are described in a progressive manner, with the description of each embodiment focusing on its differences from others. Reference can be made between the embodiments for their identical or similar parts. Since the system embodiments correspond to the method embodiments, they are described relatively briefly, and reference can be made to the method embodiments for details in the system embodiments.

It is to be noted that, while the invention has been described with reference to several preferred embodiments, it is not intended to be limited to these embodiments in any way. In light of the teachings hereinabove, any person of skill in the art may make various possible variations and changes to the disclosed embodiments or modify them into equivalent alternatives, without departing from the scope of the invention. Accordingly, any and all such simple variations, equivalent alternatives and modifications made to the foregoing embodiments without departing from the scope of the invention are intended to fall within the scope thereof.

It is to be noted that, as used herein, the terms "first", "second" and the like are only meant to distinguish various components, elements, steps, etc. from each other rather than necessarily indicate logical or sequential orderings thereof, unless otherwise indicated or specified.

It is also to be understood that the terminology used herein is used for the purpose of describing particular embodiments only, and is not intended to limit the scope of the present invention. It must be noted that as used herein and in the appended claims, the singular forms "a" and "an" include the plural reference unless the context clearly dictates otherwise. Thus, for example, a reference to "a step" or "a means" is a reference to one or more steps or means and may include sub-steps and subservient means. All conjunctions used are to be understood in the most inclusive sense possible. Thus, the term "or" should be understood as having the definition of a logical "or" rather than that of a logical "exclusive or" unless the context clearly necessitates otherwise. Implementation of the methods and/or device according to the embodiments of the present invention involves performing or completing certain selected tasks or steps manually, automatically, or a combination thereof.

What is claimed is:

1. A device, comprising:
   a substrate with a trench therein;
   a gate dielectric layer covering an inner surface of the trench,
   a gate conductive layer over the gate dielectric layer and within the trench, wherein a top surface of the gate conductive layer is lower than a top surface of the gate dielectric layer; and
   an insulating dielectric layer on the gate conductive layer;
   a cover layer covering a side surface of the gate dielectric layer away from the trench, wherein the cover layer provided among of the gate dielectric layer, the gate conductive layer and the insulating dielectric layer, and directly contact with the gate dielectric layer, the gate conductive layer and the insulating dielectric layer mutually.

2. The device of claim 1, wherein a thickness of the second dielectric layer in a direction perpendicular to a side surface of the trench is greater than a thickness of the first dielectric layer in the direction perpendicular to the side surface of the trench.

3. The device of claim 1, wherein the gate dielectric layer comprises an upper portion and a lower portion, the upper portion covering a portion of the inner surface of the trench that is higher than a first predetermined height level, the lower portion covering a portion of the inner surface of the trench that is lower than the first predetermined height level, the upper portion further comprising a liner layer covering the inner surface of the trench,
   wherein a difference between the thickness of the lower portion and the thickness of the cover layer is smaller than the thickness of the liner layer.

4. The device of claim 1, wherein the gate dielectric layer comprises an upper portion and a lower portion, the upper portion covering a portion of the inner surface of the trench that is higher than a first predetermined height level, the lower portion covering a portion of the inner surface of the trench that is lower than the first predetermined height level, the upper portion further comprising a liner layer covering the inner surface of the trench,
   wherein in the gate dielectric layer, a difference between the thickness of the lower portion and the thickness of the liner layer is smaller than the thickness of the cover layer.

5. The device of claim 4, wherein the gate dielectric layer comprises a first dielectric layer and a second dielectric layer,
   the first dielectric layer covering the inner surface of the trench, a portion of the first dielectric layer lower than the first predetermined height level forming the lower portion, and a portion of the first dielectric layer higher than the first predetermined height level forming the liner layer, the second dielectric layer covering the portion of the first dielectric layer higher than the first predetermined height level and forming the cover layer.

6. The device of claim 4, wherein the cover layer protrudes from the lower portion in a direction away from the inner surface of the trench.

7. The device of claim 6,
the gate conductive layer extending from the lower portion to the upper portion, wherein a portion of the gate conductive layer higher than the first predetermined height level has a width smaller than a width of a portion of the gate conductive layer lower than the first predetermined height level.

8. The device of claim 4, wherein the gate dielectric layer comprises a first dielectric layer and a second dielectric layer,
the first dielectric layer covering a portion of the inner surface of the trench higher than the first predetermined height level and forming the liner layer, the second dielectric layer covering both the first dielectric layer and a portion of the inner surface of the trench lower than the first predetermined height level, a portion of the second dielectric layer higher than the first predetermined height level forming the cover layer and a portion of the second dielectric layer lower than the first predetermined height level forming the lower portion.

9. The device of claim 8, wherein a thickness of the first dielectric layer in a direction perpendicular to the side surface of the trench is greater than a thickness of the second dielectric layer in the direction perpendicular to the side surface of the trench.

10. The device of claim 8, wherein the liner layer protrudes from the lower portion in a direction toward the inner surface of the trench.

11. The device of claim 10,
the gate conductive layer having a side boundary geometrically conforming to a side surface of the second dielectric layer so as to extend from the lower portion to the upper portion.

12. The device of claim 4,
the gate conductive layer having a top higher than the first predetermined height level so that the gate conductive layer extends from the lower portion to the upper portion of the gate dielectric layer.

13. The device of claim 12, further comprising:
a source/drain region, having a bottom boundary lower than the top of the gate conductive layer and higher than the first predetermined height level so that the source/drain region is separated from the gate conductive layer by the upper portion of the gate dielectric layer.

14. A method of fabricating a device, the method comprising:
providing a substrate with a trench formed therein; and
forming a gate dielectric layer over an inner surface of the trench, the gate dielectric layer comprising an upper portion and a lower portion, the upper portion covering a portion of the inner surface of the trench higher than a first predetermined height level, the lower portion covering a portion of the inner surface of the trench lower than the first predetermined height level, the upper portion comprising a liner layer and a cover layer, the liner layer covering the inner surface of the trench, the cover layer covering a side surface of the liner layer away from the trench, wherein a sum of a thickness of the liner layer and a thickness of the cover layer is greater than a thickness of the lower portion,
wherein the gate dielectric layer is formed subsequent to the formation of the trench, and wherein the formation of the gate dielectric layer comprises:
forming a first dielectric layer over the inner surface of the trench;
filling a sacrificial layer in the trench, which is filled up from a bottom of the trench to the first predetermined height level, with a side surface portion of the first dielectric layer higher than the sacrificial layer being exposed;
forming a second dielectric layer on the exposed side surface portion of the first dielectric layer, wherein the first and second dielectric layers form the gate dielectric layer, a portion of the first dielectric layer lower than the first predetermined height level forming the lower portion, a portion of the first dielectric layer higher than the first predetermined height level forming the liner layer, and the second dielectric layer forming the cover layer; and
removing the sacrificial layer.

15. The method of claim 14, further comprising, subsequent to the formation of the gate dielectric layer:
forming a gate conductive layer in the trench, the gate conductive layer having a top higher than the first predetermined height level so that the gate conductive layer extends from the lower portion to the upper portion of the gate dielectric layer.

16. The method of claim 14, further comprising, subsequent to the formation of the gate dielectric layer:
forming a source/drain region in the substrate, the source/drain region having a bottom boundary lower than the top of the gate conductive layer and higher than the first predetermined height level so that the source/drain region is separated from the gate conductive layer by the upper portion of the gate dielectric layer.

17. A method of fabricating a device, the method comprising:
providing a substrate with a trench formed therein; and
forming a gate dielectric layer over an inner surface of the trench, the gate dielectric layer comprising an upper portion and a lower portion, the upper portion covering a portion of the inner surface of the trench higher than a first predetermined height level, the lower portion covering a portion of the inner surface of the trench lower than the first predetermined height level, the upper portion comprising a liner layer and a cover layer, the liner layer covering the inner surface of the trench, the cover layer covering a side surface of the liner layer away from the trench, wherein a sum of a thickness of the liner layer and a thickness of the cover layer is greater than a thickness of the lower portion,
wherein the trench is formed during the formation of the gate dielectric layer, and wherein the formation of the trench and the gate dielectric layer comprises:
forming a first trench in the substrate, which has a bottom located at the first predetermined height level;
forming a first dielectric layer on a side surface of the first trench;
with the first dielectric layer serving as a mask, etching the substrate at the bottom of the first trench to form a second trench, the second trench vertically communicating with the first trench to form the trench; and forming a second dielectric layer in the trench, which covers both an inner surface of the second trench and a side surface of the first dielectric layer away from the trench, wherein the second dielectric layer and the first dielectric layer form the gate dielectric layer, the first dielectric layer forming the liner layer, a portion of the second dielectric layer over the first dielectric layer forming the cover layer, and a portion of the second dielectric layer over the inner surface of the second trench forming the lower portion.

18. The method of claim 17, further comprising, subsequent to the formation of the gate dielectric layer:
    forming a gate conductive layer in the trench, the gate conductive layer having a top higher than the first predetermined height level so that the gate conductive layer extends from the lower portion to the upper portion of the gate dielectric layer.

19. The method of claim 17, further comprising, subsequent to the formation of the gate dielectric layer:
    forming a source/drain region in the substrate, the source/drain region having a bottom boundary lower than the top of the gate conductive layer and higher than the first predetermined height level so that the source/drain region is separated from the gate conductive layer by the upper portion of the gate dielectric layer.

* * * * *